(12) United States Patent
Yuzurihara et al.

(10) Patent No.: US 12,323,074 B2
(45) Date of Patent: Jun. 3, 2025

(54) RF BAND POWER SUPPLY DEVICE AND PULSE WIDTH MODULATION CONTROL METHOD

(71) Applicant: KYOSAN ELECTRIC MFG. CO., LTD., Yokohama (JP)

(72) Inventors: Itsuo Yuzurihara, Yokohama (JP); Tomohiro Yoneyama, Yokohama (JP); Shohei Kobayashi, Yokohama (JP); Yu Hosoyamada, Yokohama (JP)

(73) Assignee: KYOSAN ELECTRIC MFG. CO., LTD.

( * ) Notice: Subject to any disclaimer, the term of this patent is extended or adjusted under 35 U.S.C. 154(b) by 127 days.

(21) Appl. No.: 18/281,023

(22) PCT Filed: Dec. 17, 2021

(86) PCT No.: PCT/JP2021/046862
§ 371 (c)(1),
(2) Date: Sep. 8, 2023

(87) PCT Pub. No.: WO2022/190515
PCT Pub. Date: Sep. 15, 2022

(65) Prior Publication Data
US 2024/0297594 A1    Sep. 5, 2024

(30) Foreign Application Priority Data
Mar. 9, 2021   (JP) ................ 2021-036852

(51) Int. Cl.
*H02M 7/527*     (2006.01)
*H02M 1/00*      (2007.01)
(Continued)

(52) U.S. Cl.
CPC ......... *H02M 7/527* (2013.01); *H02M 1/0025* (2021.05); *H02M 1/12* (2013.01); *H02M 7/53871* (2013.01)

(58) Field of Classification Search
CPC ............. H02M 1/0054; H02M 7/5387; H02M 7/5395; H02M 1/12; H02M 7/53871;
(Continued)

(56) References Cited

U.S. PATENT DOCUMENTS

| | | |
|---|---|---|
| 3,706,038 A | 12/1972 | Austin et al. |
| 6,777,881 B2 | 8/2004 | Yuzurihara et al. |

(Continued)

FOREIGN PATENT DOCUMENTS

| | | |
|---|---|---|
| CN | 109980975 A | 7/2019 |
| JP | 4-4756 A | 1/1992 |

(Continued)

OTHER PUBLICATIONS

Office Action dated Nov. 20, 2024, issued in counterpart KR Application No. 10-2023-7031891, with English translation. (5 pages).

(Continued)

*Primary Examiner* — Antony M Paul
(74) *Attorney, Agent, or Firm* — WHDA, LLP

(57) ABSTRACT

The pulse width modulation control method and RF band power supply device according to the present invention are a pulse width modulation (PWM) control of a single phase PWM inverter in which the modulated wave frequency fs of a modulated wave is set in the RF band. The present control includes each of (a) a frequency synchronization control in which the carrier wave frequency fc of the carrier wave is set to even N times the modulated wave frequency fs, (b) an odd function control in which the modulated wave is set to a sine wave of an odd function and the carrier wave is set to a (Continued)

triangle wave of an odd function, and (c) a phase synchronization control in which the carrier wave is synchronized in phase with the modulated wave in each cycle of the modulated wave.

10 Claims, 7 Drawing Sheets

(51) Int. Cl.
*H02M 1/12* (2006.01)
*H02M 7/5387* (2007.01)

(58) Field of Classification Search
CPC ........ H02M 7/527; H02M 7/49; H02M 3/155; H02M 3/156; H02M 3/157; H02M 3/1588; H02M 1/0025; H03F 1/0205; H03F 2200/451; H03F 3/217; H03F 2200/351; H03F 2200/301; H03F 2200/391; H03F 2200/387; H03F 3/19; H03F 3/21; H03F 3/2171; H02P 27/04; H02P 27/06; H02P 27/08; H02P 27/085
See application file for complete search history.

(56) References Cited

U.S. PATENT DOCUMENTS

2007/0052489 A1 3/2007 Ballantyne et al.
2017/0054421 A1* 2/2017 Buono ................... H03F 3/68
2018/0219508 A1 8/2018 Arisawa et al.
2019/0341851 A1 11/2019 Yuzurihara et al.

FOREIGN PATENT DOCUMENTS

| JP | H09-201056 A | 7/1997 |
| JP | 2001-119953 A | 4/2001 |
| JP | 2001-320884 A | 11/2001 |
| JP | 2010-207084 A | 9/2010 |
| JP | 2011-041298 A | 2/2011 |
| JP | 2015-53824 A | 3/2015 |
| KR | 20190084306 A | 7/2019 |
| WO | 2017/026061 A1 | 2/2017 |

OTHER PUBLICATIONS

Extended (Supplementary) European Search Report dated Jan. 24, 2025, issued in counterpart EP Application No. 21930360.9. (8 pages).
International Search Report dated Feb. 8, 2022, issued in counterpart International Application No. PCT/JP2021/046862. (2 pages).
Decision to Grant dated Nov. 20, 2024, issued in counterpart KR Application No. 10-2023-7031891, with English translation. (5 pages).

* cited by examiner

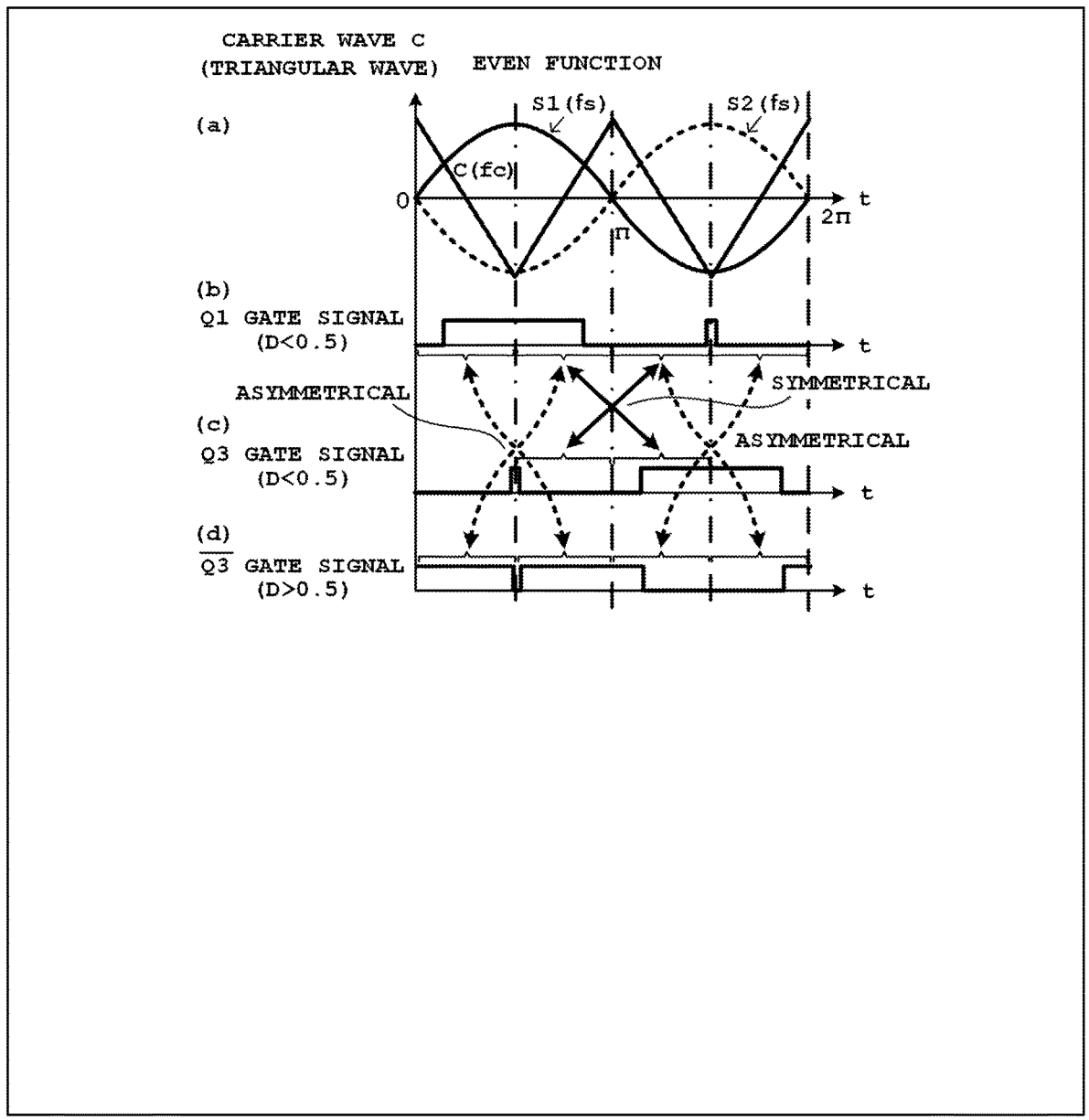

RF BAND POWER SUPPLY DEVICE AND PULSE WIDTH MODULATION CONTROL METHOD

TECHNICAL FIELD

The present invention relates to an RF band power supply device and a pulse width modulation control method for outputting a sine wave in a radio frequency (RF) band. The radio frequency (RF) band includes a low frequency (LF) band (30 kHz to 300 kHz), a medium frequency (MF) band (300 kHz to 3 MHz), a high frequency (HF) band (3 MHz to 30 MHZ), a very high frequency (VHF) band (30 MHz to 300 MHz), and an ultrahigh frequency (UHF) band (300 MHz to 30 GHZ). The section of Detailed Description of the Invention below presents an example of utilizing the HF band for the RF band.

BACKGROUND ART

An analog amplifying circuit and a digital amplifying circuit are known as amplifying circuits in an RF band. The analog amplifying circuit falls under class-A, class-B or class-C depending on its bias amount. A class-D amplifying circuit is known as a digital amplifying circuit, which is composed of a single-phase square-wave inverter in an RF band. Conventionally, an RF band power supply for outputting a sine wave employs any of the class-A to class-C amplifying circuits. However, it is known that such an amplifying circuit has difficulty in increasing in capacity due to low efficiency with a large loss.

A class-D amplifying circuit composed of a single-phase pulse width modulation (PWM) inverter in an RF band includes a class-D full-bridge amplifier formed of a single-phase full-bridge circuit consisting of semiconductor switching elements, such as MOSFETs. The single-phase PWM inverter is used as a power conversion device for performing PWM control on a bridge circuit by switching on and off a semiconductor switching element, so as to convert a DC voltage in a DC power supply into an AC voltage.

The power conversion device composed of the single-phase PWM inverter compares two opposite modulation waves with a carrier wave to generate a PWM signal, and controls an ON/OFF switching operation of a switching element of the single-phase PWM inverter by using the generated PWM signal to thereby obtain an AC waveform of a sine wave output having a unipolar waveform. It means that the two opposite waveforms are opposite in polarity and are out of phase with each other by 180 degrees, and the polarity of the unipolar waveform is either positive or negative.

Patent Literature 1 discloses a PWM inverter that converts a DC voltage into an AC voltage at a variable voltage variable frequency by PWM control to output a sine wave. Patent Literature 2 discloses an inverter device that converts DC power into commercial AC power, in which a frequency of a PWM carrier signal is set to be an integral multiple of a frequency of a current command signal so that switching operations of a first arm and a second arm of a full-bridge circuit can be synchronized. Patent Literature 2 shows an example that the frequency of the PWM carrier signal is set to 20 kHz, and the frequency of the current command signal is set to 50 Hz.

In a PWM inverter, an unknown number N representing a relationship between a carrier wave frequency and a modulation wave frequency corresponds to the number of switching pulses that corresponds to the number of pulses in one period of a modulation wave. N is required to be an integer number so that the number of pulses does not vary in one period of the modulation wave.

CITATION LIST

Patent Literature

[Patent Literature 1] Japanese Patent Laid-Open Publication No. H04-4756 (4756/1992)
[Patent Literature 2] Japanese Patent Laid-Open Publication No. 2001-320884

SUMMARY OF THE INVENTION

Problems to be Solved by the Invention

A single-phase PWM inverter is operated in an RF band to output a high-efficiency sinusoidal alternate current. Thus, the single-phase PWM inverter performs power conversion on a DC voltage into an AC voltage by switching an ON/OFF operation of each switching element included in the single-phase PWM inverter by using a PWM pulse. A signal of the PWM pulse is generated by comparing a modulation wave with a carrier wave. The single-phase PWM inverter uses two opposite sine waves as modulation waves to produce an inverter output voltage having a unipolar waveform. The output voltage of this inverter output has a sine wave at the same frequency as that of the modulation wave.

The single-phase inverter uses two legs consisting of series-connected switching elements of an upper arm and a lower arm to form a single-phase full bridge by connecting the two legs in parallel, and controls one of the legs with a PWM pulse signal having one of two opposite phases while controlling the other leg with a PWM pulse signal having the other opposite phase. A load is connected to a midpoint between the legs of the upper and lower arms, and currents are applied in opposite directions to make the load to be an AC load, thereby performing the power conversion on the DC voltage into the AC voltage.

The frequency band of a sine wave output in the present invention is an RF frequency. The RF frequency is different from a commercial frequency in synchronization deviations in the respective frequency bands.

In the band of the commercial frequency, a carrier wave frequency fc at 20 kHz or higher is typically selected to be used, which is higher than an audible frequency, so that the synchronization deviation in the carrier wave frequency is small enough to be ignored because the number of pulses N is large. Thus, in the band of the commercial frequency, there is less necessity to take into consideration a frequency deviation in the carrier wave frequency fc caused depending on the setting of the number of pulses N with respect to a modulation wave frequency fs.

By contrast, in the band of the RF frequency, when the large number of pulses N is used as with the case of the band of the commercial frequency, the frequency deviation in the carrier wave frequency fc is small, but the carrier frequency is very high because the band is a high frequency band. In addition to that, the use of the large number of pulses N causes excessive switching loss and is therefore not suitable for an RF band power supply device. Thus, the small number of pulses N is used in the RF band.

The single-phase PWM inverter controls the switching element with a PWM pulse generated by comparing two opposite modulation waves with a carrier wave. In this control, in a case where the number of PWM pulses N in one period of the modulation wave is limited to a small value, signal characteristics of the modulation wave and the carrier wave, such as phases, frequencies and waveforms, are affected by the characteristics of the PWM pulse. In particular, the operation of the single-phase PWM inverter in the RF band is heavily influenced. It is therefore necessary to reduce the influence on the characteristics of the PWM pulse.

In the case of limiting the number of the pulses N to the small value, the occurrence of a phase deviation between the modulation wave and the carrier wave in each period of the modulation wave causes a difference in the PWM pulse signals for controlling switching elements between the legs in the single-phase PWM inverter. The difference in the PWM pulse signals in the legs causes a bias in the balance of power losses between the legs. The bias in the balance of the power losses between the legs results in power fluctuation in the AC output from the single-phase PWM inverter.

For less and stable power fluctuation in the sine wave output from the single-phase PWM inverter, it is necessary to prevent the power fluctuation in each leg. Thus, it is required to use a PWM pulse in each leg of the single-phase PWM inverter in which symmetry is provided to a voltage waveform in each positive or negative half period of the modulation wave so that the fluctuation does not occur in the output power in each period of the modulation wave.

(Asymmetry in Gate Signal According to Even Function)

The carrier wave C is made to be an odd function or an even function with respect to the modulation wave S to achieve the symmetry in the output waveform.

However, in the case where a PWM pulse output is generated by comparing two modulation wave having phases opposite to each other with the carrier wave and the obtained PWM pulse signal is used to control a switching element of the single-phase PWM inverter, it is necessary to achieve the symmetry in a signal waveform of a gate signal in a half period which range is narrower than the range of one period of the modulation wave.

When the carrier wave C is an even function with respect to the modulation wave S, gate signals that drive the switching elements of each of parallel-connected two legs are asymmetrical waveforms in a positive half period or negative half period of the modulation wave. The asymmetry of the gate signal in the half period causes a bias in the switching loss. Thus, a duty ratio D in one period of the modulation wave deviates from 0.5. The deviation of the duty ratio D from 0.5 leads to a bias in the ON loss in each switching element.

Consequently, the carrier wave of the even function can achieve the waveform symmetry in the one period of the modulation wave S. However, since the duty ratio D deviates from 0.5 due to the asymmetrical waveform of the gate signal in the half period of the modulation wave S, the bias in the ON loss occurs in each switching element.

FIG. 8 illustrates the asymmetry in the gate signal by the even function. FIG. 8(*a*) shows the modulation wave and the carrier wave, FIG. 8(*b*) shows the gate signal of a switching element Q1 in one of the legs, FIG. 8(*c*) shows the gate signal of a switching element Q3 in the other leg, and FIG. 8(*d*) shows an inversion signal of the gate signal of the switching element Q3.

In FIG. 8(*a*), a modulation wave S1 is represented by a sine wave indicated by a solid line, a modulation wave S2 having an opposing phase shifted by π is represented by a sine wave indicated by a broken line, and the carrier wave C is represented by a triangular wave indicated by a solid line. In addition to that, the inversion signal of the gate signal of the switching element Q3 shown in FIG. 8(*d*) is indicated by signing with a bar over the letters "Q3". Furthermore, the figures represent the symmetry by an arrow in the white ground color and the asymmetry by an arrow in the black ground color. FIG. 8 shows an example in which the number of pulses N of the carrier wave C is "2", and the carrier wave C has an even function relative to the modulation wave S.

The comparison between the waveform of the gate signal of the element Q1 (FIG. 8(*b*)) and the waveform of the gate signal of the element Q3 (FIG. 5(C)) shows the symmetry at a point n of a half period in one period $2\pi$. By contrast, the comparison between the waveform of the gate signal of the element Q1 (FIG. 8(*b*)) and the waveform of the inverted gate signal of the element Q3 (FIG. 8(*d*)) shows the asymmetry at points $\pi/2$ and $3\pi/2$ of quarter-periods in half period $\pi$. The inverted gate signal of the element Q3 corresponds to a gate signal of an element Q4. Due to this asymmetry, the duty ratio D of a switching element Q2 and the switching element Q4 is larger than 0.5, resulting in the deviation of the ratio D from 0.5. By contrast, the duty ratio D of the switching element Q1 and the switching element Q3 is smaller than 0.5.

The deviation of the duty ratio D from 0.5 causes a bias in the ON loss in each switching element. Furthermore, the deviation of the duty ratio D from 0.5 is a factor of a deviation in a mean voltage $V_{mean}$ at a midpoint of the legs of the bridge circuit from a voltage Vd/2 which is an intermediate voltage of an input voltage Vd in the DC power source. The deviation in the mean voltage $V_{mean}$ at the midpoint from the intermediate voltage Vd/2 causes the generation of a DC voltage component in an AC load connected to a midpoint between two legs. It is essential to apply a transmission transformer system using a pulse transformer for high frequency transmission in an RF band. However, when transmitting a pulse signal to each gate for driving a gate signal, it is difficult to transmit a pulse signal that contains a DC voltage component to each gate via the pulse transformer, so that the drive control cannot be performed on the single-phase PWM inverter.

Thus, since the duty ratio D deviates from 0.5 in the carrier wave of the even function, there arises problems of the bias in the ON loss in each switching element and maladaptation to the transmission transformer system using the pulse transformer.

It is an object of the present invention to solve the above-described conventional problems and prevent the bias in the switching loss in each leg in the single-phase PWM inverter in the RF band, in particular, to prevent the bias in the switching loss in a half period.

The present invention intends to achieve the symmetry in the waveform of the gate signal between the quarter-periods (¼ periods) and control the duty ratio D to be 0.5 in one period of the modulation wave S.

By controlling the duty ratio D in one period of the modulation wave S to be 0.5, the present invention also aims to eliminate the bias in the ON loss in each switching element to thereby equalize the loss, and to adapt to the transmission transformer system using the pulse transformer.

Means for Solving the Problem

The present invention relates to a pulse width modulation control method and an RF band power supply device on which pulse width modulation control is performed. The control according to the invention is pulse width modulation (PWM) control for a single-phase PWM inverter, in which a gate signal is generated on the basis of a comparison between a modulation wave and a carrier wave, and the generated gate signal is used as a PWM pulse signal to perform the pulse width modulation (PWM) control on the single-phase PWM inverter.

The present invention outputs a sine wave in an RF band. Thus, in the control according to the invention, a modulation wave frequency fs of the modulation wave is a high frequency in the RF band and a carrier wave frequency fc of the carrier wave is higher than the modulation wave frequency fs. The RF band includes a low frequency (LF) band (30 kHz to 300 kHz), a medium frequency (MF) band (300 kHz to 3 MHZ), a high frequency (HF) band (3 MHz to 30 MHZ) and a very high frequency (VHF) band (30 MHz to 300 MHz), and the pulse width modulation control and the RF band power supply device of the present invention outputs a sine wave in the RF band.

The present invention has the following control:
(a) frequency synchronization control defining the carrier wave frequency fc of the carrier wave to be even-number N times higher than the modulation wave frequency fs;
(b) odd function control defining the modulation wave as a sine wave of an odd function and the carrier wave as a triangular wave of an odd function; and
(c) phase synchronization control that synchronizes a phase of the carrier wave with a phase of the modulation wave in each period of the modulation wave.

(a) Frequency Synchronization Control

The frequency synchronization control is for controlling the carrier wave frequency fc to be even-number N times higher than the modulation wave frequency fs, in which the carrier wave frequency fc is defined according to a relationship of fc=N·fs. The frequency synchronization control defines the carrier wave frequency fc with respect to the modulation wave frequency fs to be fc=N·fs to establish an even multiple (N-multiple) relationship between the frequency of the modulation wave and the frequency of the carrier wave, so that an alternation between a signal waveform of the carrier wave in an anterior half period and a signal waveform of the carrier wave in a posterior half period in one period of the modulation wave is ensured, and furthermore symmetry in a gate signal (PWM pulse signal) of a switching element is ensured, so as to prevent a bias in the switching loss in each leg of a single-phase PWM inverter in one period of the modulation wave.

In the frequency synchronization control, the value of N is changed so that the range of the carrier wave frequency fc can be changed with respect to the range of the modulation wave frequency fs. For example, in regard to the range of the carrier wave frequency in which an upper limit frequency and a lower limit frequency are set, the carrier wave frequency fc is defined to be kept within a predetermined frequency range by changing the value of N even when the modulation wave frequency fs is changed.

In the pulse width modulation (PWM) control, the value of N corresponds to the number of pulses generated in one period of the modulation wave. The value of N is changed to a smaller value with respect to the high modulation wave frequency fs to set the carrier wave frequency fc, thereby decreasing the number of pulses and thus preventing the switching loss.

In a commercial frequency band, a synchronization deviation in the carrier wave frequency is small enough to be ignored because the number of pulses is large. By contrast, in the RF frequency band, the synchronization deviation in the carrier wave frequency is too large to ignore because the number of pulses is small. Thus, the number of pulses N is required to be a small integer in the single-phase PWM inverter in the RF band.

As an example of the small number of pulses N, the value may be the integer from 2 to 14. The value of 14 indicated in here as the largest integer is one example, and thus integers larger than 14 are not be excluded.

By setting the number of pulses N to an integer, there is an integral multiple relationship between the carrier wave frequency fc and the modulation wave frequency fs. This integral multiple relationship synchronizes the period of the carrier wave with the period of the modulation wave. The period synchronization ensures the periodicity in the carrier wave in each period of the modulation wave, thereby preventing a deviation of the gate signal (PWM pulse signal) of the switching element caused by the synchronization deviation.

In the integral multiple relationship between the modulation wave frequency fs and the carrier wave frequency fc, an even multiple makes the waveform in the anterior half period and the waveform in the posterior half period in one period of the modulation wave to be point symmetry. The point symmetry in the waveforms due to the even multiple relationship between the frequencies ensures the symmetry of the gate signal (PWM pulse signal) of the switching element, and thus prevents the bias in the switching loss in each leg of the single-phase PWM inverter in the one period of the modulation wave.

Accordingly, the carrier wave frequency fc is defined to fc=N·fs with respect to the modulation wave frequency fs and is made to be even-number times (N times) higher than the modulation wave frequency fs to ensure the alternation between the signal waveform of the carrier wave in the anterior half period and the signal waveform of the carrier wave in the posterior half period in one period of the modulation wave and further ensure the symmetry in the gate signal (PWM pulse signal) of the switching element, thereby preventing the bias in the switching loss in each leg of the single-phase PWM inverter in the one period of the modulation wave.

(b) Odd Function Control

The symmetry in the waveforms per se between the modulation wave and the carrier wave in one period can be achieved by both of the odd function and the even function. However, in order to ensure the symmetry in the gate signal (PWM pulse signal) of the switching element and prevent the bias in the switching loss and the bias in the ON loss under a normal condition in each switching element in one period of the modulation wave, it is necessary to perform the odd function control.

(Signal Waveforms of Modulation Wave and Carrier Wave)

There are two combinations of the modulation wave and the carrier wave, i.e., both of the waves have the odd function or have the even function. In either case, the output waveforms can keep the symmetry, and the odd function control with both waveforms being odd functions provides the symmetry in which the duty ratio D of the gate signal (PWM pulse signal) of each switching element is 50%, so that the bias in the switching loss and the bias in the ON loss under the normal condition in each switching element in one period of the modulation wave can be prevented.

With respect to the modulation wave of the odd function, the carrier wave of the odd function is symmetrical about the point on a time base in which positive and negative are reversed at a phase time point of n in the half period of the modulation wave as a reference time point. The odd function control provides the symmetry in which the duty ratio D of the gate signal (PWM pulse signal) of each switching element is 50% with respect to the modulation wave of the sine wave which is the odd function, thereby preventing the bias in the switching loss and the bias in the ON loss under the normal condition in each switching elements in one period of the modulation wave.

On the other hand, in the case of the even function control, the gate signal (PWM pulse signal) of each switching element is asymmetrical, causing the bias in the switching loss and the bias in the ON loss under the normal condition in each switching element.

The signal waveform of the carrier wave that is the even function with respect to the modulation wave of the even function has the symmetry on the time base before and after the phase time point with the phase time point of n in the half period of the modulation wave as a reference time point. With respect to the modulation wave with a cosign waveform of the even function, the carrier wave of the even function can have a triangular signal waveform, for instance. However, since the gate signal (PWM pulse signal) of each switching element is asymmetrical, the bias in the switching loss and the bias in the ON loss under the normal condition occur in each switching element.

(c) Phase Synchronization Control

In the PWM control, when the carrier wave is not synchronized with the modulation wave in the phases, there is a difference in the gate signals (PWM pulse signals) included in the respective periods of the modulation wave, resulting in the fluctuation in an output voltage in each period. In addition, a harmonic included in an AC output fluctuates significantly every period. This periodic fluctuation in the harmonic causes a bias in the loss balance in each switching element.

The phase synchronization control on the modulation wave and the carrier wave synchronizes the phases of the modulation wave and the carrier wave in each period of the modulation wave to prevent a phase deviation. The odd function control is performed on the modulation wave and the carrier wave to align the end of a period of the carrier wave with the end of one period of the modulation wave, thereby enabling the carrier wave in the one period of the modulation wave to ensure the same phase in each period.

The aspect of the RF band power supply device and the aspect of the pulse width modulation control method according to the present invention have the above-described frequency synchronization control, the odd function control and the phase synchronization control.

<RF Band Power Supply Device>

The RF band power supply device of the present invention includes a DC power source, a single-phase PWM inverter and an inverter controller.

The single-phase PWM inverter includes a single-phase full-bridge circuit formed by connecting two legs in parallel between a positive terminal and a negative terminal of the DC power source, the legs having upper and lower arms on which switching elements are disposed, and is configured to perform an ON/OFF operation on each switching element to transform a DC input supplied by the DC power source into an AC output.

The inverter controller is configured to generate a gate signal based on a comparison of a modulation wave with a carrier wave, and use the generated gate signal as a PWM pulse signal to perform the ON/OFF operation on the switching element to perform pulse width modulation (PWM) control on the single-phase PWM inverter.

The inverter controller includes a PWM control unit and a modulation wave/carrier wave generation unit for generating a gate signal (PWM pulse signal).

(A) Modulation Wave/Carrier Wave Generation Unit

The modulation wave/carrier wave generation unit sets a modulation wave frequency fs of a modulation wave as a frequency in an RF band, and includes a frequency synchronization unit, an odd function control unit and a phase synchronization unit.

(a) Frequency Synchronization Unit

The frequency synchronization unit sets the carrier wave frequency fc of the carrier wave to be even-number N times higher than the modulation wave frequency fs, so as to synchronize the period of the carrier wave with the period of the modulation wave. The frequency synchronization between the carrier wave and the modulation wave makes the number N of the carrier wave to be an even number in one period of the modulation wave, and the carrier wave also has the even number N in each period of the adjacent modulation waves. The carrier wave is point symmetry in which positive and negative of the carrier wave are reversed at a phase time point of n in the half period as a reference time point in one period $2\pi$ of the modulation wave.

(b) Odd Function Control Unit

The odd function control unit controls both of the sine wave of the modulation wave and the triangular wave of the carrier wave to be odd function. By controlling the carrier wave C to be the odd function or an even function with respect to the modulation wave S in one period of the modulation wave, the symmetry can be achieved in the waveform. However, in a case of controlling the switching element of the single-phase PWM inverter by using the gate signal (PWM pulse signal) generated by comparing the carrier wave with two opposite modulation waves, it is required to achieve the symmetry in the waveform of the gate signal (PWM pulse signal) in a half period of the modulation wave that is narrower than one period. This symmetry can equalize the switching loss between the legs of the single-phase full-bridge circuit, thereby preventing the bias in the switching loss.

When the carrier wave C is the even function with respect to the modulation wave S, the waveform is asymmetry in a gate signal that drives the switching element of each of two parallel-connected legs in a positive half period or negative half period in one period of the modulation wave. In a case where the gate signal in the half period is asymmetrical, the duty ratio D in one period of the modulation wave deviates from 0.5. The deviation of the duty ratio D from 0.5 causes the bias in the ON loss in each switching element.

The odd function control unit controls the waveforms of both of the modulation wave and the carrier wave to be the odd function so as to achieve the symmetrical waveform in the gate signal driving the switching element of each of two parallel-connected legs in the positive half period or negative half period in the one period of the modulation wave. The gate signal symmetrical in the half period is set to have the duty ratio D of 0.5 in the one period of the modulation wave. By setting the duty ratio D to 0.5, the bias in the switching loss and the bias in the ON loss under the normal condition in each switching element can be prevented.

(1) Alternation of Time-Series Patterns in Gate Signals (PWM Pulse Signals) by Odd Function Control The odd function control unit performs the odd function control to provide the alternation between the two modulation waves having the opposite phases, thereby alternating the position of the time-series patterns of the gate signal in an anterior half period and the position of the time-series pattern of the gate signal in a posterior half period of the modulation wave in each period $2\pi$ of the modulation wave for each leg for every half period $\pi$ of the modulation wave.

The alternation is a property that the time-series patterns of the gate signals (PWM pulse signals) reverse every half period $\pi$ between the first leg and the second leg, and thus the time-series patterns of the gate signals (PWM pulse signals) reverse between the first leg and the second leg in the anterior half period and the posterior half period. The alternation of the time-series patterns of the gate signals (PWM pulse signals) produce an effect of equalizing power loss in the switching elements occurring in the one period of the modulation wave between the legs.

(2) Symmetry of Time-Series Patterns in Gate Signals (PWM Pulse Signals) by Odd Function Control The odd function control unit alternates the time-series pattern in the gate signal (PWM pulse signal) in an anterior quarter-period and the time-series pattern in the gate signal (PWM pulse signal) in a posterior quarter-period of the modulation wave in each half period $\pi$ of the modulation wave for each leg for every quarter-period $\pi/2$ of the modulation wave, so as to generate a pulse signal symmetrical at a phase time point in the quarter-period $\pi/2$ as a reference time point. The symmetry of the time-series patterns in the gate signals (PWM pulse signals) brings the duty ratio D to be 0.5 in the one period $2\pi$ of the modulation wave, thereby equalizing the ON loss in the switching loss under the normal condition between the legs. Furthermore, by equalizing the ON loss, a mean voltage $V_{mean}$ at a midpoint of the legs of the single-phase bridge circuit becomes an intermediate voltage of the input voltage Vd in the DC power source.

By making the mean voltage $V_{mean}$ at the midpoint of the legs to be the intermediate voltage of the input voltage Vd in the DC power source, a DC bias component in a midpoint voltage in the pulse transformer is eliminated. Consequently, the transmission transformer system using the pulse transformer can be employed for the high-frequency transmission in the RF band, so that the gate signal (PWM pulse signal) can be transmitted to each gate through the pulse transformer to perform the drive control on the single-phase PWM inverter.

(c) Phase Synchronization Unit

The phase synchronization unit is configured to synchronize the phase of the carrier wave with the phase of the modulation wave in each period of the modulation wave. In the phase synchronization between the waveforms, a phase time point of zero phase on a front edge of one period of the modulation wave coincides a phase time point of zero phase of the first of the N-number of carrier waves in the one period of the modulation wave, and a phase time point of $2\pi$ phase on a rear edge of the one period of the modulation wave coincides a phase time point of $2\pi$ phase of the last of the N-number of carrier waves in the one period of the modulation wave.

(B) PWM Control Unit

The inverter controller includes a PWM control unit that generates a PWM pulse signal.

The PWM control unit performs the following control using two modulation waves having the opposite phases to provide alternation that the time-series patterns of the gate signals (PWM pulse signals) are reversed in the half period $\pi$ by the odd function control.

(a) One of the modulation waves having the opposite phases is compared with the carrier wave to generate a gate single (PWM pulse signal) with a time-series pattern, in which the time-series pattern in the anterior half period of the modulation wave is a first time-series pattern and the time-series pattern in the posterior half period of the modulation wave is a second time-series pattern, thereby driving a switching element of one of the legs in one period of the modulation wave.

(b) The other modulation wave having the opposite phase is compared with the carrier wave to generate a gate signal (PWM pulse signal) with a time-series pattern, in which the time-series pattern in an anterior half period of the modulation wave is a second time-series pattern and the time-series pattern in a posterior half period of the modulation wave is a first time-series pattern, thereby driving a switching element of the other leg in one period of the modulation wave.

(c) In the one period of the modulation wave, the gate signal (PWM pulse signal), in which the gate signal (PWM pulse signal) with the first time-series pattern and the gate signal (PWM pulse signal) with the second time-series pattern are alternated during the anterior half period and the posterior half period of the modulation wave and alternated between the two legs, is used to perform the drive control on the switching element of each leg by the gate signal (PWM pulse signal) with the first time-series pattern and the gate signal (PWM Pulse signal) with the second time-series pattern, so as to convert a DC input into an AC output by the pulse width modulation (PWM).

The PWM control unit performs the following control by using the two modulation waves having the opposite phases to provide the alternation in the quarter-period $\pi/2$ to the time-series pattern of the gate signal (PWM pulse signal) by the odd function control.

(a) One of the modulation waves having the opposite phases is compared with the carrier wave to generate a gate signal with the first time-series pattern and the second time-series pattern for driving the switching element of the one of the legs in one period of the modulation wave.

(b) The other modulation wave having the phase deviated by n with respect to the phase of the aforementioned modulation wave is compared with the carrier wave to generate a gate signal with the second time-series pattern and the first time-series pattern for driving the switching element of the other leg in one period of the modulation wave.

(c) In each half period of the modulation wave, the gate signal with the first time-series pattern and an inversion signal of the gate signal with the second time-series pattern are symmetrical at a phase time point in each quarter-period as a reference time point.

(d) In the one period of the modulation wave, the gate signal with the first time-series pattern and the gate signal with the second time-series pattern in each quarter-period are used to perform the drive control on the switching element of each leg to convert a DC input into an AC output by the pulse width modulation (PWM).

(PWM Control by Inverter Controller)

The inverter Controller performs the following control in the PWM control using the time-series patterns of the gate signals (PWM pulse signals).

The Inverter Controller Performs:

(a) in a steady state, the control to match a time-series pattern of a pulse signal for driving a switching element of one of the legs in an anterior half period of a modulation wave to a time-series pattern of a pulse signal for driving a switching element of the other leg in a posterior half period of the modulation wave;

(b) in the steady state, the control to match the time-series pattern of the pulse signal for driving the switching element of one of the legs in the posterior half period of the modulation wave to the time-series pattern of the pulse signal for driving the switching element of the other leg in the anterior half period of the modulation wave; and (c) in one period of the modulation wave, the drive control on the switching element of each leg by using the pulse signal with one of the time-series patterns and the pulse signal with the other time-series pattern for each half period, thereby converting a DC input into an AC output by the pulse width modulation (PWM).

(Configuration Example 1 of PWM Control Unit)

The PWM control unit includes two comparison circuits, in which:

(a) one of the two comparison circuits is configured to compare one of the modulation waves S having the opposite phases with the carrier wave C to generate a gate signal (PWM pulse signal) for driving the switching element of one of the two legs; and (b) the other of the two comparison circuits is configured to compare the other modulation wave S having the opposite phase to generate a gate signal (PWM pulse signal) for driving the switching element of the other of the two legs.

<Pulse Width Modulation Control Method>

The pulse width modulation control method is for performing the pulse width modulation (PWM) control on the single-phase PWM inverter by generating a gate signal based on the comparison between the modulation wave in the RF band and the carrier wave, and using the generated gate signal as a PWM pulse signal to perform the pulse width modulation (PWM) control on the single-phase PWM inverter that outputs a sine wave in the RF band.

The pulse width modulation control method sets the modulation wave frequency fs of the modulation wave to a frequency in the RF band, and includes the following steps.

(a) A frequency synchronizing step is for setting the carrier wave frequency fc of the carrier wave to be even-number N times higher than the modulation wave frequency fs.

(b) An odd function control step is for controlling the modulation wave to be a sine wave of an odd function and the carrier wave to be a triangular wave of an odd function.

(c) A phase synchronizing step is for synchronizing the phase of the carrier wave with the phase of the modulation wave in each period of the modulation wave.

(1) Creation of time-series pattern having alternation for gate signal (PWM pulse signal) in odd function control step:

The odd function control step achieves point symmetry in which positive and negative of the carrier wave are reversed at a phase time point in the half period π as a reference time point in one period 2π of the modulation wave, so as to alternate the time-series pattern of the gate signal (PWM pulse signal) in the anterior half period and the time-series pattern of the gate signal (PWM pulse signal) in the posterior half period of the modulation wave for each leg for every half period π of the modulation wave in each period 2π of the modulation wave to thereby provide the alternation at the phase time point of the half period π as the reference time point.

(2) Creation of time-series pattern having symmetry in gate signal (PWM pulse signal) in odd function control step:

The odd function control step controls the carrier wave to be point symmetry in which positive and negative are reversed at the phase time point in the half period π as the reference time point in the one period 2π of the modulation wave. With respect to the gate signal (PWM pulse signal), the odd function control step makes the gate signal with the first time-series pattern to be symmetrical with an inversion signal of the gate signal with the second time-series pattern at the phase time point in the quarter-period as the reference time point.

Effect of the Invention

As described above, according to the present invention, it is possible to prevent the bias in the switching loss in each leg in the single-phase PWM inverter in the RF band. In particular, the bias in the switching loss in each leg in the half period can be prevented.

In the half period of the modulation wave S, the waveform of the gate signal is symmetrical at a point of the quarter-period (¼ period), and the duty ratio D in the one period of the modulation wave S can be controlled to be 0.5.

BY controlling the duty ratio D in the one period of the modulation wave S to be 0.5, the bias in the loss in each switching element can be eliminated to thereby equalize the losses. In addition, by making the mean voltage at the midpoint between the legs to be half of the voltage in the DC power source, the bias in the voltage can be prevented, thereby enabling the application of the transmission transformer system using the pulse transformer in the high-frequency transmission of the gate signal (PWM pulse signal) in the RF band.

BRIEF DESCRIPTION OF THE DRAWINGS

FIG. 8 illustrates the asymmetry between the gate signals (PWM pulse signals) brought by the even function.

BEST MODE FOR CARRYING OUT THE INVENTION

Figure 2:
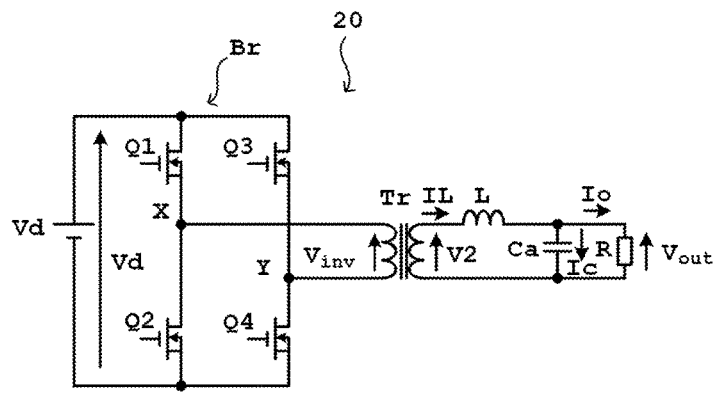
FIG. 2 shows a circuit example illustrating configuration examples of a single-phase PWM inverter and a low-pass filter.
Figure 3:
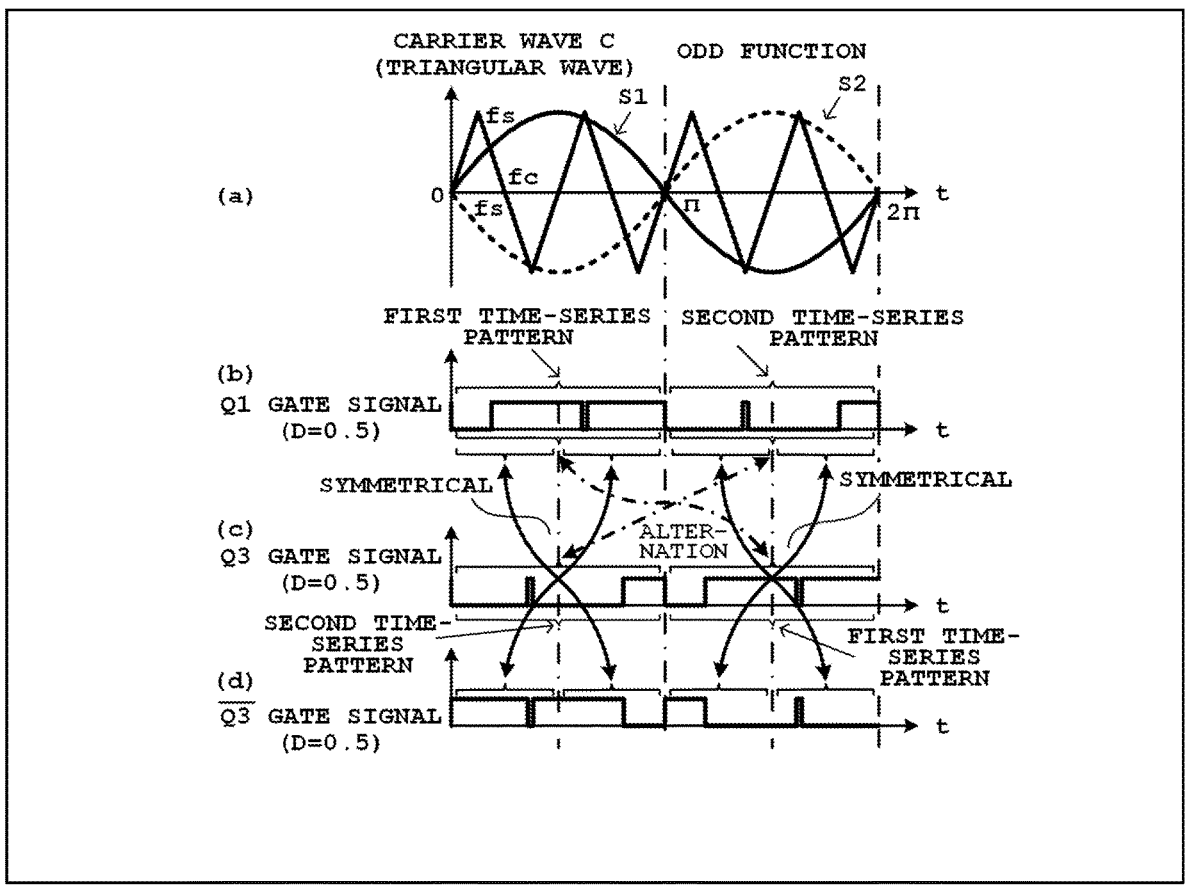
FIG. 3 illustrates symmetry between gate signals (PWM pulse signals)
Figure 4:
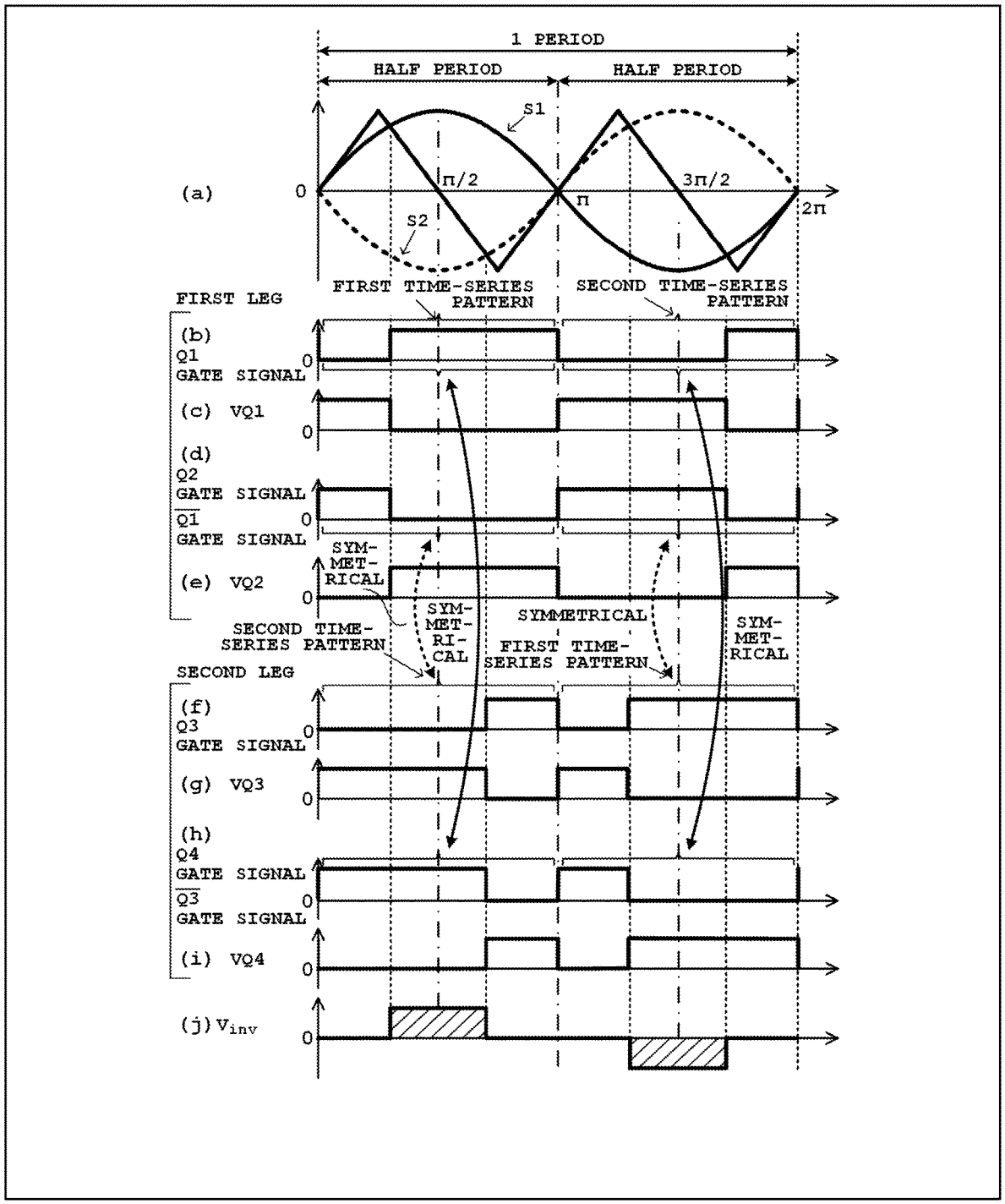
FIG. 4 illustrates an odd function and the symmetry between the gate signals (PWM pulse signals)
Figure 5:
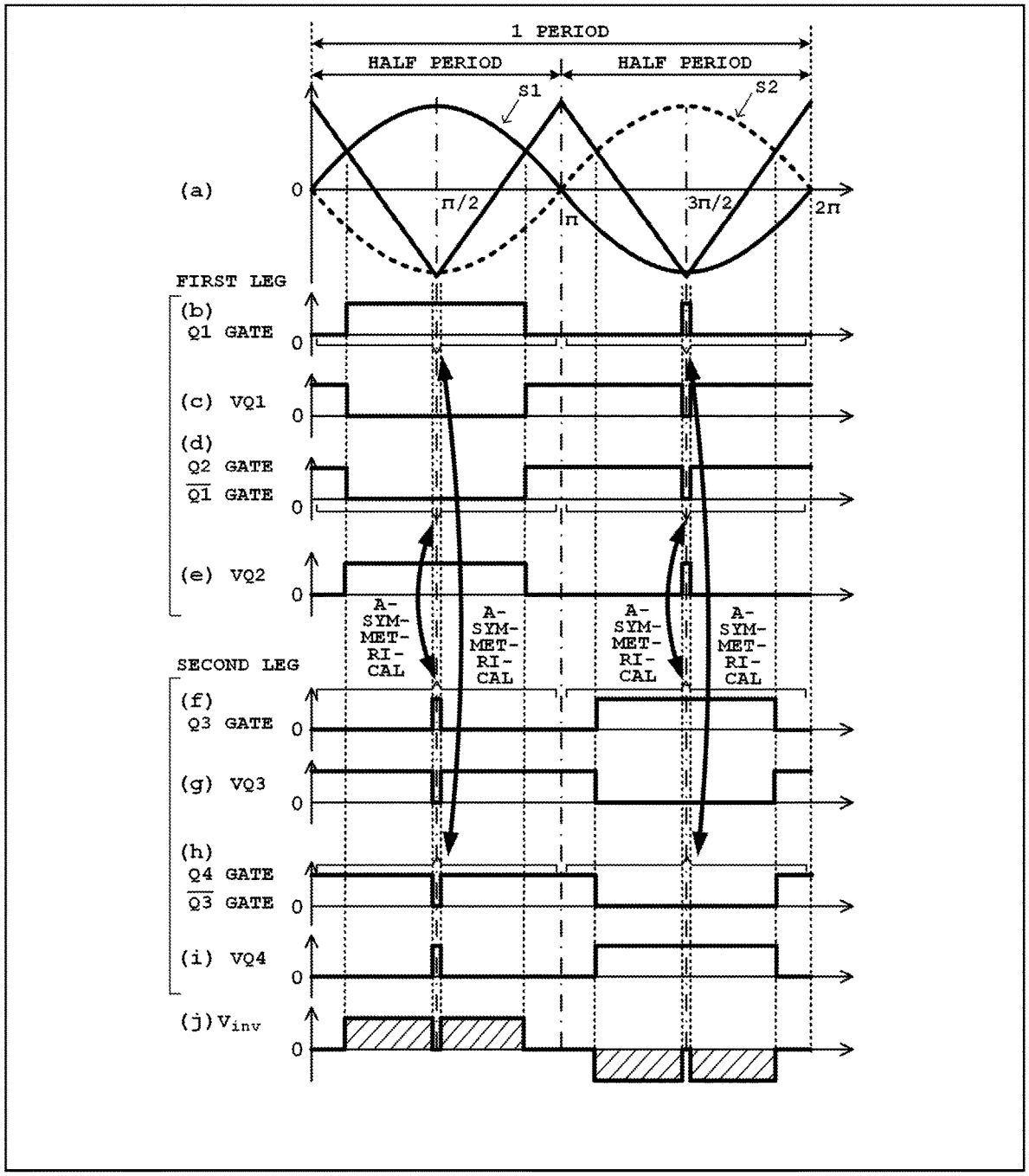
FIG. 5 illustrates an even function and asymmetry between the gate signals (PWM pulse signals)
Figure 6:
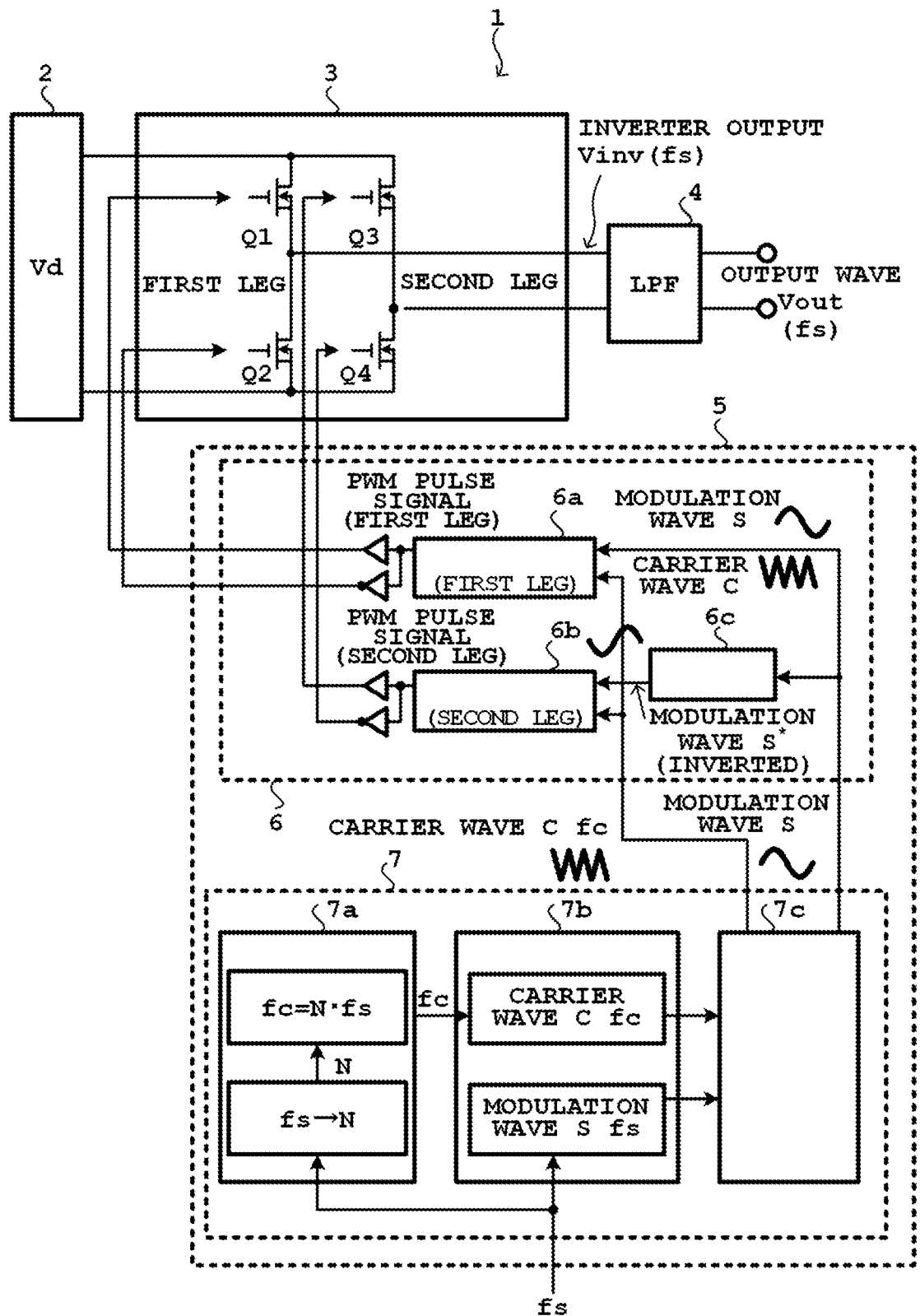
FIG. 6 is a diagram illustrating a configuration example of the present invention.
Figure 7:
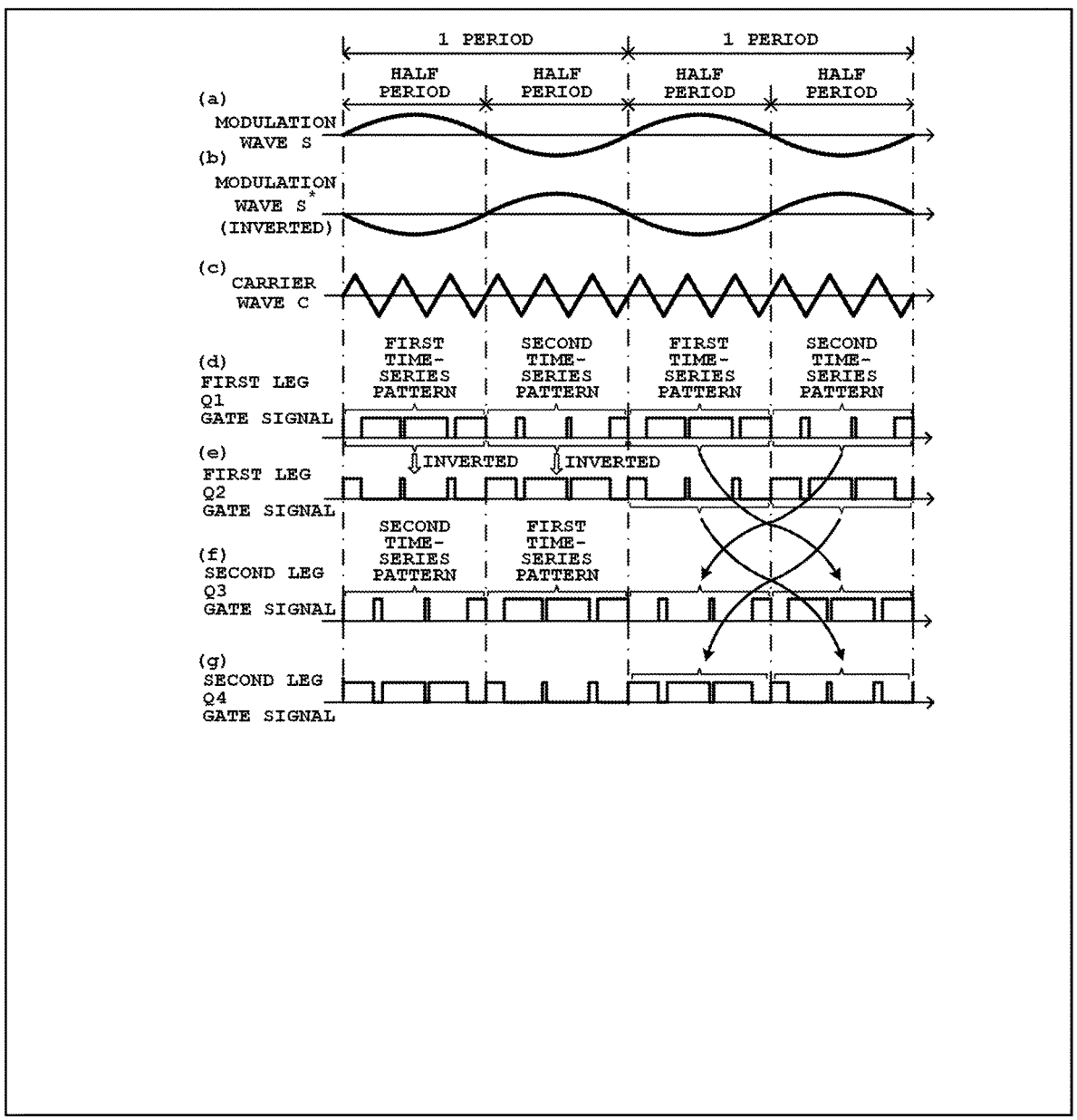
FIG. 7 is a signal waveform chart illustrating a configuration example of the present invention.

An outline of the present invention will be described by referring to FIGS. 1 and 2, examples of waveforms when both of a modulation wave and a carrier wave are odd functions are shown by FIGS. 3 and 4, and examples of the waveforms when the carrier wave is an even function is shown by FIG. 5. FIGS. 6 and 7 illustrate configuration examples of the present invention.

<Schematic Configuration of the Invention>

Figure 1:
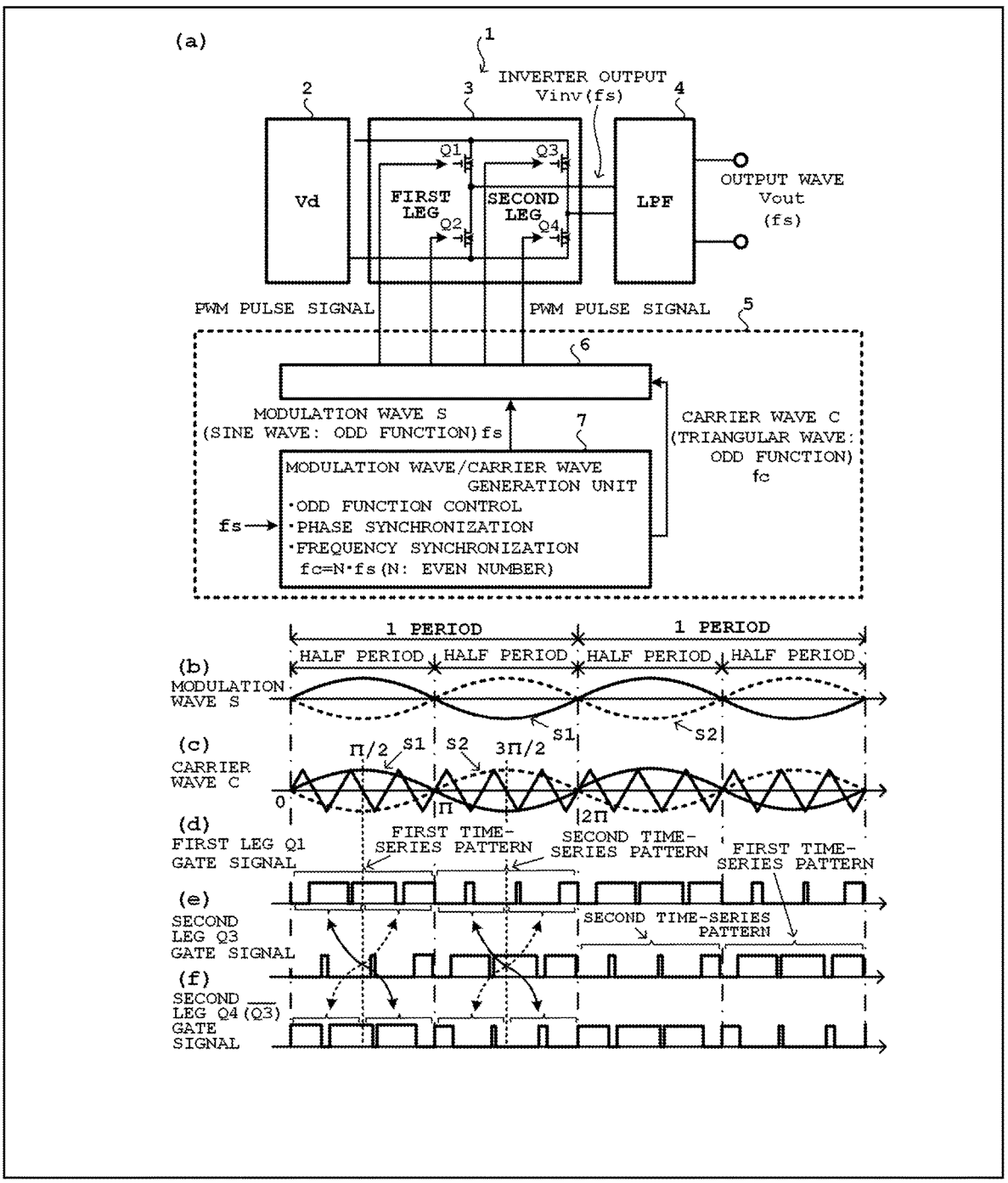
FIG. 1 is a schematic block diagram illustrating a schematic configuration of an RF band power supply device according to the present invention, and also showing signal waveforms.

FIG. 1 is a schematic diagram illustrating a schematic configuration of an RF band power supply device of the invention, and also is a signal waveform chart. FIG. 1(a) shows a schematic configuration, FIGS. 1(b) and 1(c) show signal waveforms of a modulation wave S and a carrier wave C, respectively, and FIGS. 1(d) and 1(e) respectively show a waveform of a gate signal (PWM pulse signal) applied to a switching element Q1 of a first leg and a waveform of a gate signal (PWM pulse signal) applied to a switching element Q3 of a second leg in a single-phase PWM inverter. FIG. 1(f) shows a waveform of a gate signal (PWM pulse signal) applied to a switching element Q4 of the second leg. The gate signal (PWM pulse signal) applied to the switching element Q4 is an inversion signal of the gate signal (PWM pulse signal) applied to the switching element Q3 of the second leg.

In FIG. 1(a), an RF band power supply device 1 includes a DC power source 2 that outputs a DC voltage, a single-phase PWM inverter 3 that converts the DC voltage supplied by the DC power source 2 into an AC voltage to thereby output an inverter output $V_{inv}$, a low-pass filter 4 that removes a harmonic component contained in the inverter output $V_{inv}$ output by the single-phase PWM inverter 3 to thereby output a sine wave output $V_{out}$, and an inverter controller 5 that performs PWM control on the single-phase PWM inverter 3. The inverter controller 5 includes a PWM control unit 6 and a modulation wave/carrier wave generation unit 7.

The single-phase PWM inverter 3 consists of a bridge circuit formed by a first leg and a second leg connected in parallel, the first leg having the switching elements Q1 and Q2 connected in series and the second leg having the switching elements Q3 and Q4 connected in series. The PWM control is performed by utilizing a pulse width of a pulse signal for ON/OFF operation for the switching elements Q1 to Q4 of the first leg and the second leg to convert a DC voltage Vd supplied by the DC power source 2 into an AC voltage, thereby outputting the inverter output $V_{inv}$.

The low-pass filter 4 removes the harmonic component contained in the inverter output $V_{inv}$ of the single-phase PWM inverter 3, and then outputs a sine wave output $V_{out}$.

FIG. 2 shows a circuit example for describing configuration examples of the single-phase PWM inverter 3 and the low-pass filter 4.

The single-phase PWM inverter 3 consists of a class-D full-bridge amplifier 20, for example, and includes a full-bridge circuit Br and an output transformer Tr. The single-phase PWM inverter 3 performs a switching operation of the full-bridge circuit Br to convert the DC voltage Vd of the DC power source to output the inverter output $V_{inv}$, thereby outputting a voltage $V_2$ from an output end of the output transformer Tr. The full-bridge circuit Br includes four switching elements, namely the switching elements Q1, Q2 and the switching elements Q3, Q4. A series circuit consisting of the switching element Q1 and the switching element Q2 forms a first leg and a series circuit consisting of the switching element Q3 and the switching element Q4 forms a second leg, thereby forming the bridge circuit. The switching elements Q1 and Q3 respectively on upper arms of the first leg and the second leg have their high voltage side connected to a high voltage side of the DC power source 2, and the switching elements Q2 and Q4 respectively on lower arms of the first leg and the second leg have their low voltage side connected to a low voltage side of the DC power source 2. A point X of the first leg and a point Y of the second leg are connected to an input end of the output transformer Tr. The single-phase PWM inverter 3 switches the ON/OFF operations between the switching elements Q1, Q2 and the switching elements Q3, Q4 by using a gate signal (PWM pulse signal) to convert the DC voltage into the AC voltage.

A freewheeling diode may be parallel-connected to each of the switching elements Q1 to Q4 to pass a current through the freewheeling diode, the current flowing backward when the switching element changes from an ON state to an OFF state, so as to prevent damage to the switching element. It is to be noted that the terms of "first leg" and "second leg" are used for the convenience of illustration, and thus there is no technical significance in the ordinal numbers of first and second.

The low-pass filter 4 is connected to the output side of the output transformer Tr to input the output $V_2$ of the output transformer Tr obtained by the inverter output $V_{inv}$ as an input converted from the DC voltage into the AC voltage by the single-phase PWM inverter 3. The low-pass filter 4 consists of an LC circuit formed by an inductor L and a capacitor Ca, for instance, and is configured to remove a harmonic component contained in the output $V_2$ of the output transformer Tr, and supplies a resultant sine wave output $V_{out}$ to a load R. A cutoff frequency of the low-pass filter 4 is set according to a frequency fs of the sine wave output $V_{out}$.

In FIG. 1, the inverter controller 5 includes the PWM control unit 6 and the modulation wave/carrier wave generation unit 7, and is configured to generate a gate signal (PWM pulse signal) for performing PWM control on the single-phase PWM inverter 3.

The PWM control unit 6 compares the modulation wave S with the carrier wave C to generate a gate signal (PWM pulse signal). The gate signal (PWM pulse signal) is a pulse signal for controlling the ON/OFF operations of the switching elements Q1 to Q4 included in the single-phase PWM inverter 3. In the first leg having the switching element Q1 and the switching element Q2 connected to each other in series, the gate signal (PWM pulse signal) for controlling the switching element Q1 and the gate signal (PWM pulse signal) for controlling the switching element Q2 have an inverted signal relationship, and a dead time is set for preventing both switching elements from being ON at the same time so that a short-circuit can be prevented between positive and negative terminals of the DC power source 2. There is the same signal relationship in the second leg in which the switching element Q3 and the switching element Q4 are connected in series, and a dead time is also set.

The modulation wave/carrier wave generation unit 7 is circuitry for generating the carrier wave C based on the modulation wave S and the number of pulses N, and is configured to perform the frequency synchronization control for synchronizing a frequency of the modulation wave S with a frequency of the carrier wave C, the odd function control for controlling both of the modulation wave S and the carrier wave C to be odd function, and the phase synchronization control for synchronizing a phase of the modulation wave S with a phase of the carrier wave C.

The frequency synchronization control multiplies a modulation wave frequency fs of the modulation wave S by the even number of pulses N to generate a frequency N·fs as a carrier wave frequency fc of the carrier wave C. The carrier wave frequency fc is integer multiple of the modulation wave frequency fs, so that the period of the modulation wave S is synchronized with the period of the carrier wave C.

The odd function control controls the waveform to be odd function for both the modulation wave and the carrier wave, so as to achieve point symmetry in which the positive and negative of the carrier wave are reversed at the phase time point in the half period π as the reference time point. The odd function control then provides the alternation to the timer-series patterns of the gate signals (PWM pulse signals) for alternating the patterns at the phase time point of the half period π of the modulation wave as the reference time point, thereby providing the symmetry that the patterns are symmetrical at the phase time point of the quarter-period π/2 of the modulation wave as the reference time point.

The alternation and the symmetry of the time-series pattern of the gate signals (PWM pulse signals) produce an effect of equalizing the power loss between the switching elements of the legs that occurs in one period of the modulation wave and an effect of equalizing the ON loss between the switching elements of the legs under the normal condition by controlling the duty ratio D to be 0.5 in the one period 2π of the modulation wave.

The phase synchronization control synchronizes the phase of the modulation wave with the phase of the carrier wave in each period of the modulation wave to control a deviation of the phase. Since the odd function control is performed on the modulation wave and the carrier wave, it is ensured that the carrier wave has the phase relationship in one period of the modulation wave for each period.

The PWM control unit 6 inputs the modulation wave S and the carrier wave C, and compares both waveforms to generate a gate signal (PWM pulse signal). The gate signals (PWM pulse signals) thus generated are used for controlling the ON/OFF operations of the switching elements Q1 to Q4 of the single-phase PWM inverter.

The modulation wave S shown in FIG. 1(b) is a sine wave of the odd function and the carrier wave C shown in FIG. 1(c) is a triangular wave of the odd function, and the modulation wave S is synchronized with the carrier wave C. A modulation wave S1 indicated by a solid line is out of phase by n with a modulation wave S2 indicated by a broken line, and the phases are opposite to each other. FIG. 1(c) shows an example in which six carrier waves C are included in one period of the modulation wave S and the number of pulses N is six.

The gate signal (PWM pulse signal) for the first leg is generated by the comparison of the solid-lined modulation wave S1 with the carrier wave C, and the gate signal (PWM pulse signal) for the second leg is generated by the comparison of the broken-lined modulation wave S2 with the carrier wave C, the phases of the wave S2 and the wave C being opposite to each other.

The gate signal (PWM pulse signal) shown in FIG. 1(d) is a pulse signal applied to the switching element Q1 of the first leg. The waveform of the gate signal (PWM pulse signal) has a first time-series pattern in an anterior half period and a second time-series pattern in a posterior half period, which are different from each other, in one period of the modulation wave S.

The gate signal (PWM pulse signal) shown in FIG. 1(e) is applied to the switching element Q3 of the second leg. The waveform of the gate signal (PWM pulse signal) has a second time-series pattern in an anterior half period and a first time-series pattern in a posterior half period, which are different from each other, in the one period of the modulation wave S. The first leg and the second leg have the first time-series pattern and the second time-series pattern alternated in the one period of the modulation wave.

The gate signal (PWM pulse signal) shown in FIG. 1(f) is applied to the switching element Q4 of the second leg, and is an inverted signal of the gate signal (PWM pulse signal) of the switching element Q3.

With reference to FIG. 3, the point symmetry of the carrier wave, the alternation and the symmetry of the gate signals (PWM pulse signals), and the duty ratio will be described. FIG. 3 shows one period of the modulation wave S. FIG. 3(a) shows the modulation wave S and the carrier wave C, and FIGS. 3(b) to 3(d) show the gate signals, FIG. 3(b) showing the gate signal of the switching element Q1 of the first leg, FIGS. 3(c), 3(d) showing the gate signals of the switching elements Q3, Q4 of the second leg. The gate signal of the switching element Q4 is an inverted signal of the gate signal of the switching element Q3. The figure shows an example of setting the number of pulses N to four for simplicity of the signal waveforms.

(Modulation Wave S and Carrier Wave C)

FIG. 3(a) shows four periods of a carrier wave of a triangular wave in one period of the modulation wave S of a sine wave. In here, the two modulation waves S1, S2 having the opposite phases are compared with the carrier wave C to generate gate signals. One of the two opposing modulation waves S1, S2, or the modulation wave S1, is indicated with a solid line, and the other modulation wave S2 is indicated with a broken line. The modulation wave S and the carrier wave C are the odd function, and are point symmetry in which positive and negative of the carrier wave C are reversed in the half period π as a reference phase point.

(Gate Signal (PWM Pulse Signal))

The gate signal (PWM pulse signal) shown in FIG. 3(b) is generated by comparing the modulation wave S1 of the sine wave indicated with the solid line with the carrier wave C of the triangular wave to drive the switching element Q1 of the first leg. This gate signal (PWM pulse signal) has a first time-series pattern in an anterior half period and a second time-series pattern in a posterior half period at a point n between the half periods.

The gate signal (PWM pulse signal) shown in FIG. 3(c) is generated by comparing the modulation wave S2 of the sine wave indicated with the broken line with the carrier wave C of the triangular wave to drive the switching element Q3 of the second leg. This gate signal (PWM pulse signal) has a second time-series pattern in an anterior half period and a first time-series pattern in a posterior half period at a point n between the half periods, and has a relationship with the gate signal (PWM pulse signal) shown in FIG. 3(b) to be altered at the point n between the half periods and is out of phase by n. In this description, this relationship is expressed as the term "alternation".

Both of the gate signal (PWM pulse signal) applied to the switching element Q1 of the first leg and the gate signal (PWM pulse signal) applied to the switching element Q3 of the second leg have the first time-series pattern and the second time-series pattern in one period of the modulation wave S. Consequently, both legs have the same switching losses in the one period, so that a bias in the switching loss between the legs is prevented.

Since the gate signal (PWM pulse signal) of the first leg shown in FIG. 3(b) and the gate signal (PWM pulse signal) of the second leg shown in FIG. 3(c) are generated by using the two modulation waves S1, S2 which are opposite to each other, the comparison of the time-series pattern of the gate signal (PWM pulse signal) of the first leg and the gate signal (PWM pulse signal) of the second leg is performed by using the time-series pattern of the gate signal (PWM pulse signal) of the first leg shown in FIG. 3(b) and a time-series pattern obtained by inverting the gate signal (PWM pulse signal) of the second leg shown in FIG. 3(c) (see FIG. 3(d)).

The time-series pattern of the gate signal (PWM pulse signal) of the first leg (FIG. 3(b)) and the time-series pattern of the gate signal (PWM pulse signal) of the second leg (FIG. 3(d)) are symmetrical relationship with each other with a quarter-period ($\pi/2$ or $3\pi/2$) as a line of symmetry. In FIGS. 3(b) and 3(d), the first time-series pattern in the anterior half period of the modulation wave S is symmetrical in the quarter-period $\pi/2$ as the line of symmetry and the second time-series pattern with the posterior half period of the modulation wave S is symmetrical with the quarter-period 3 m/2 as the line of symmetry.

(Duty Ratio D)

In the symmetry of the time-series pattern of the gate signals (PWM pulse signals), the duty ratio D in the period $2\pi$ of the modulation wave is controlled to be 0.5, so as to equalize the ON loss in the switching element between the legs under the normal condition. Furthermore, the equalization of the ON loss makes a mean voltage $V_{mean}$ at a midpoint between the legs of the single-phase bridge circuit to be an intermediate voltage of an input voltage Vd of the DC power source.

(Alternation and Symmetry of Gate Signals (PWM Pulse Signals))

In regard to the alternation and the symmetry of the gate signals (PWM pulse signals), a description will be made by comparing the odd function control with the even function control. FIG. 4 shows gate signals (PWM pulse signals) subjected to the odd function control, and FIG. 5 shows gate signals (PWM pulse signals) subjected to the even function control.

Odd Function Control:

The odd function control will now be described. FIG. 4(a) shows two periods of the carrier wave C of a triangular wave in one period of each of the modulation waves S1, S2 of sine waves. The two modulation waves S1, S2 having the opposite phases are compared with the carrier wave C to generate gate signals. One of the two opposite modulation waves S1, S2, namely modulation wave S1, is indicated with a solid line, and the other of modulation wave S2 is indicated with a broken line. Both of the modulation wave S and the carrier wave C are odd function, and are point symmetry in which positive and negative of the carrier wave C are reversed with the half period $\pi$ as a base phase point.

FIGS. 4(b) to 4(e) show gate signals of the first leg and voltages between the switching elements. FIGS. 4(b) and 4(c) show the gate signal of the switching element Q1 and a voltage VQ1 between the switching elements, and FIGS. 4(d) and 4(e) show the gate signal of the switching element Q2 and a voltage VQ2 between the switching elements. The gate signal of the switching element Q2 is an inverted signal of the gate signal of the switching element Q1.

FIGS. 4(f) to 4(i) show gate signals of the second leg and voltages between the switching elements. FIGS. 4(f) and 4(g) show the gate signal of the switching element Q3 and a voltage VQ3 between the switching elements, and FIGS. 4(h) and 4(i) show the gate signal of the switching element Q4 and a voltage VQ4 between the switching elements. The gate signal of the switching element Q4 is an inverted signal of the gate signal of the switching element Q3.

Alternation:

The time-series patterns of the gate signals in both of the first leg and the second leg have the alternation. The time-series pattern of the gate signal of the switching element Q1 (FIG. 4(b)) and the time-series pattern of the gate signal of the switching element Q2 (FIG. 4(d)) of the first leg have the alternation that the order of these patterns alternates at the point $\pi$ of the half period in the one period of the modulation wave S. Correspondingly, the time-series pattern of the gate signal of the switching element Q3 (FIG. 4(f)) and the time-series pattern of the gate signal of the switching element Q4 (FIG. 4(h)) of the second leg have the alternation that the order of these patterns alternates.

Symmetry:

The time-series patterns of the gate signals in both of the first leg and the second leg are symmetrical with each other.

In the half period of the modulation wave S, the time-series pattern of the gate signal of the switching element Q1 of the first leg (FIG. 4(b)) and the time-series pattern of the gate signal of the switching element Q4 of the second leg (FIG. 4(h)) are symmetrical with each other at the point $\pi/2$ of the quarter-period and at the point $3\pi/2$ of the quarter-period. Correspondingly, the time-series pattern of the gate signal of the switching element Q2 of the first leg (FIG. 4(d)) and the time-series pattern of the gate signal of the switching element Q3 of the second leg (FIG. 4(f)) are symmetrical with each other at the point $\pi/2$ of the quarter-period and the point $3\pi/2$ of the quarter-period.

Duty Ratio:

In the symmetry of the time-series patterns of the gate signals (PWM pulse signals), the duty ratio D in one period $2\pi$ of the modulation wave is controlled to be 0.5, so as to equalize the ON loss in the switching element between the legs under the normal condition, and the mean voltage $V_{mean}$ at the midpoint between the legs of the single-phase bridge circuit is made to be the intermediate voltage of the input voltage Vd in the DC power source.

FIG. 4 shows that the duty ratio D of the gate signal of the element Q1 is the same as that of the gate signal of the element Q2, and furthermore the gate signals of the elements Q1 and Q2 are inverted with respect to each other. The gate signals of the elements Q3 and Q4 are also inverted, so that the duty ratios D of the first leg and the second leg become 0.5. Consequently, the duty ratios D of the gate signals of the elements Q1 to Q4 are 0.5.

FIG. 4(j) shows an output voltage $V_{inv}$ of the PWM inverter, and a voltage in a positive direction is output in one of the half periods of the modulation wave S, and a voltage in a negative direction is output in the other half period. The switching loss occurs at an ON time and an OFF time of each of the switching elements Q1 to Q4. The switching loss in the first leg and the switching loss in the second leg occur at a phase time point which is symmetrical at a point between the quarter-periods in each half period, and the power loss in each switching element occurring in the one period of the modulation wave is equalized for each leg.

Even Function Control:

The even function control will now be described. FIG. 5(a) shows the modulation waves S1, S2 and the carrier wave C. As with FIG. 4(a), FIG. 5(a) shows two periods of the carrier wave of the triangular wave in one period of each modulation wave S1, S2 of the sine wave. The two modulation waves S1, S2 having the opposite phases are compared with the carrier wave C to generate gate signals. One of the two opposite modulation waves S1, S2, namely modulation wave S1, is indicated with a solid line, and the other of modulation wave S2 is indicated with a broken line. From the point of view of the quarter-period $\pi/2$ or $3\pi/2$ as a reference point, both of the modulation wave S and the carrier wave C are even functions. The carrier wave C has same polarity with the point n between the half periods as the reference phase point and thus has the symmetry.

FIGS. 5(b) to 5(e) show the gate signals of the first leg and voltages between the switching elements. FIGS. 5(b) and 5(c) show the gate signal of the switching element Q1 and a voltage between the switching elements, and FIGS. 5(d) and 5(e) show the gate signal of the switching element Q2 and a voltage between the switching elements. The gate signal of the switching element Q2 is an inverted signal of the gate signal of the switching element Q1.

FIGS. 5(f) to 5(i) show the gate signals of the second leg and voltages between the switching elements. FIGS. 5(f) and 5(g) show the gate signal of the switching element Q3 and a voltage between the switching elements, and FIGS. 5(h) and 5(i) show the gate signal of the switching element Q4 and a voltage between the switching elements. The gate signal of the switching element Q4 is an inverted signal of the gate signal of the switching element Q3.

Non-Alternation:

In each of the first leg and the second leg, the time-series patterns of the gate signals do not have the alternation. In one period of the modulation wave S, the time-series pattern of the gate signal of the switching element Q1 and the time-series pattern of the gate signal of the switching element Q2 in the first leg have no alternation that the order of the patterns alternates at the point $\pi$ of the half period, and thus these patterns are different from each other.

Correspondingly, the time-series pattern of the gate signal of the switching element Q3 and the time-series pattern of the gate signal of the switching element Q4 in the second leg have no alternation.

Asymmetry:

The time-series patterns of the gate signals in the first leg and the second leg are asymmetrical with each other between the legs.

In a half period of the modulation wave S, the time-series pattern of the gate signal of the switching element Q1 in the first leg is asymmetrical with the time-series pattern of the gate signal of the switching element Q4 in the second leg at the point $\pi/2$ of the quarter-period and at the point $3\pi/2$ of the quarter-period. Correspondingly, the time series pattern of the gate signal of the switching element Q2 in the first leg is asymmetrical with the time-series pattern of the gate signal of the switching element Q3 in the second leg at the point $\pi/2$ of the quarter-period and at the point $3\pi/2$ of the quarter-period.

The asymmetry of the time-series pattern of the gate signals (PWM pulse signals) causes a deviation of the duty ratio D from 0.5 in the one period $2\pi$ of the modulation wave, and thus the ON loss in the switching element under the normal condition is not equal between the legs, resulting in the mismatch between the mean voltage $V_{mean}$ at the midpoint between the legs of the single-phase bridge circuit and the intermediate voltage of the input voltage Vd of the DC power source.

FIG. 5(j) shows the output voltage $V_{inv}$ of the PWM inverter, and the voltage in the positive direction is output in one of the half periods of the modulation wave S, and the voltage in the negative direction is output in the other half period.

The switching loss occurs at the ON time and the OFF time of each of the switching elements Q1 to Q4. The switching loss in the first leg and the switching loss in the second leg occur at the phase time point which is asymmetrical at the point between the quarter-periods in each half period, and the power loss in the switching element occurring in the one period of the modulation wave is not equal between the legs.

<Configuration Example of Inverter Controller>

A configuration example of the inverter controller of the invention will be described by referring to a block diagram shown in FIG. 6 and a signal waveform chart shown in FIG. 7.

The inverter controller 5 includes a PWM control unit 6 that generates a gate signal and a modulation wave/carrier wave generation unit 7. The modulation wave/carrier wave generation unit 7 includes a frequency synchronization unit 7a that sets the modulation wave frequency fs of the modulation wave to be in an RF band and the carrier wave frequency fc to be even-number N times higher than the modulation wave frequency fs, an odd function control unit 7b that controls the modulation wave S to be a sine wave of an odd function and the carrier wave C to be a triangular wave of an odd function, and a phase synchronization unit 7c that synchronizes a phase of the carrier wave C with a phase of the modulation wave S in each period of the modulation wave.

Frequency Synchronization Unit 7a:

The frequency synchronization unit 7a sets the carrier wave frequency fc to be even-number N times higher than the modulation wave frequency fs to synchronize the frequency of the carrier wave with the frequency of the modulation wave. The carrier wave frequency fc is set based on a relationship of fc=N·fs. The modulation wave frequency fs is set in accordance with a frequency of a sine wave output from the PWM inverter. Thus, the carrier wave frequency fc is defined with N as a coefficient in accordance with the sine wave output and the modulation wave frequency fs of the modulation wave. The coefficient N is an even number corresponding to the number of PWM pulses in one period of the modulation wave S, and the modulation wave frequency fs is synchronized with the carrier wave frequency fc through the relationship of the even number N.

In the frequency synchronization control, even if the range of the modulation wave fs is changed, the value of N is changed so that the range of the carrier wave frequency fc is limited to a predetermined level regardless of the change in the range of the modulation wave frequency fs.

For example, a frequency limit range of the carrier wave frequency is set by an upper limit frequency and a lower limit frequency, and the value of N is changed as the range of the modulation wave frequency fs is changed, so as to limit the range of the carrier wave frequency fc to the frequency limit range. Since the carrier wave frequency fc falls within a predetermined frequency limit range, the switching loss can be prevented.

For example, the carrier wave frequency fc is set according to the following procedure.

(a) The upper limit frequency and the lower limit frequency of the carrier wave frequency fc are set to thereby set the frequency limit range for the carrier wave frequency fc.

(b) On the basis of the relationship of fc=N·fs, the value of N is defined such that the carrier wave frequency fc falls within the frequency limit range in response to the change in the modulation wave frequency fs, and thereby the modulation wave frequency fs is associated with the number of PWM pulses N. The modulation wave frequency fs may be associated with a combination of the number of PWM pulses N and a modulation wave frequency section to which the number of PWM pulses N is set.

(c) A value of the number of PWM pulses N associated with a modulation wave frequency fs that corresponds to a sine wave output of the PWM inverter is used to set the carrier wave frequency fc based on the relationship of fc=N·fs.

The following Table 1 shows an example of limiting the carrier wave frequency fc to the frequency range by changing the number of PWM pulses N with respect to the range of the change in the modulation wave frequency fs. The frequency range of the modulation wave shown in Table 1 is examples of frequency bands corresponding to a medium frequency (MF) band (300 kHz to 3 MHz) and a high frequency (HF) band (3 MHz to 30 MHz) in a radio frequency (RF) band. The frequency range of the modulation wave is not limited to these examples.

TABLE 1

| Number of PWM Pulses N | Modulation Wave Frequency Section | Carrier Wave Frequency Section |
| --- | --- | --- |
| N = 4 | 13.56 MHz ≥ fs ≥ 9.04 MHz | 54.24 MHz ≥ fc ≥ 36.16 MHz |
| N = 6 | 9.04 MHz ≥ fs ≥ 6.03 MHz | 54.24 MHz ≥ fc ≥ 36.18 MHz |
| N = 8 | 6.03 MHz ≥ fs ≥ 4.52 MHz | 48.24 MHz ≥ fc ≥ 36.16 MHz |
| N = 10 | 4.52 MHz ≥ fs ≥ 3.62 MHz | 45.20 MHz ≥ fc ≥ 36.20 MHz |
| N = 12 | 3.62 MHz ≥ fs ≥ 3.02 MHz | 43.44 MHz ≥ fc ≥ 36.24 MHz |
| N = 14 | 3.02 MHz ≥ fs ≥ 2.59 MHz | 42.28 MHz ≥ fc ≥ 36.26 MHz |

The example of the number of PWM pulses N and the frequency section shown in Table 1 includes the range of the modulation wave frequency fs set to 2.59 MHz to 13.56 MHz and the range of the carrier wave frequency set to 36.16 MHz to 54.24 MHZ. However, it is merely one example and not to be restricted thereto.

Each modulation wave frequency section is associated with the number of PWM pulses N, and the relationship of fc=N·fs is therefore maintained. When the frequency range is 13.56 MHZ≥ fs≥9.04 MHz, the modulation wave frequency section is associated with the number of PWM pulses N of "4", and when the modulation wave frequency range is 3.02 MHz≥ fs≥2.59 MHz, the modulation wave frequency section is associated with the number of PWM pulses N of "14". The number of PWM pulses N is changed based on the modulation wave frequency fs.

In this way, even if the modulation wave frequency fs changes in a wide range, the number of PWM pulses N is changed to a number associated with the changed modulation wave frequency fs, and then the carrier frequency fc is set based on the relationship of fc=N·fs, so as to keep the range of the carrier frequency fc within the predetermined frequency control range to prevent the switching loss, and synchronize the frequency of the carrier wave C with the frequency of the modulation wave S.

In the frequency synchronization between the carrier wave C and the modulation wave S, there are the even number N of the carrier waves C in one period of the modulation wave S, and there are also the even number N of the carrier waves C in each period of adjacent modulation waves. Thus, the carrier waves C are point symmetry in which the positive and negative of the carrier wave C are reversed at the phase time point in the half period π as the reference time point in the one period 2π of the modulation wave S.

Odd Function Control Unit 7b:

The odd function control unit 7b controls the modulation wave S to be a sine wave and the carrier wave C to be a triangular wave, and controls both waveforms to be odd functions.

By controlling the waveforms of both of the modulation wave S and the carrier wave C to be the odd functions, symmetrical waveforms can be achieved in the gate signals in a positive half period or negative half period in the one period of the modulation wave S, the signals driving the switching elements included in the two legs connected in parallel. When the gate signals are symmetrical in the half period, the duty ratio D in the one period of the modulation wave is 0.5, so that the bias in the switching loss and the bias in the ON loss under the normal condition in each switching element can be prevented.

(1) Alternation of Time-Series Pattern of Gate Signals (PWM Pulse Signals) by Odd Function Control The odd function control and two modulation waves having the opposite phases provide the alternation of the time-series pattern of the gate signal in the anterior half period and the time-series pattern of the gate signal in the posterior half period of the modulation wave in each period 2π of the modulation wave, the alternation having the positional relationship that alternates the patterns in each leg for each half period π of the modulation wave.

(2) Symmetry in Time-Series Patterns of Gate Signals (PWM Pulse Signals) by Odd Function Control In each half period π of the modulation wave, the time-series pattern of the gate signal (PWM pulse signal) in the anterior quarter-period and the time-series pattern of the gate signal (PWM pulse signal) in the posterior quarter-period of the modulation wave are alternated in each leg for each quarter-period π/2 of the modulation wave, so as to generate a gate signal symmetrical at the phase time point in the quarter-period π/2 as the reference time point.

The symmetry of the time-series patterns of the gate signals (PWM pulse signals) brings the duty ratio D to be 0.5 in the one period 2π of the modulation wave, thereby equalizing the ON loss between the switching elements under the normal condition in each leg. Furthermore, the equalization of the ON loss enables the mean voltage $V_{mean}$ at the midpoint between the legs of the single-phase bridge circuit to be one half of the input voltage Vd of the DC power source, so that a DC bias component in a midpoint voltage can be eliminated. Consequently, the transmission transformer system using the pulse transformer can be employed for the high-frequency transmission of the gate signal (PWM pulse signal) in the RF band, thereby transmitting the gate signal (PWM pulse signal) to each gate through the pulse transformer to perform the drive control on the single-phase PWM inverter.

Phase Synchronization Unit 7c:

The phase synchronization unit 7c synchronizes the phase of the carrier wave with the phase of the modulation wave in each period of the modulation wave. In the phase synchronization between both waveforms, the time point of zero phase on a front edge of one period of the modulation wave coincides the time point of zero phase of the first of the N-number of carrier waves in the one period of the modulation wave, and the time point of a 2π phase on a rear edge of the one period of the modulation wave coincides the time point of the 2π phase of the last of the N-number of carrier waves in the one period of the modulation wave.

The phase synchronization is performed according to the following procedure.

(a) One of the modulation waves S having the opposite phases is compared with the carrier wave C to drive the switching element in one of the legs in the one period of the modulation wave, so as to generate a gate signal having the time-series pattern in the anterior half period of the modulation wave as the first time-series pattern and the time-series pattern in the posterior half period of the modulation wave as the second time-series pattern.

(b) The other modulation wave that has a phase shifted by n with the above-mentioned modulation wave is compared with the carrier wave to drive the switching element in the other leg in the one period of the modulation wave, so as to generate a gate signal having the time-series pattern in the anterior half period of the modulation wave as the second time-series pattern and the time-series pattern in the posterior half period of the modulation wave as the first time-series pattern.

(c) In each half period of the modulation wave, the symmetry is established between the gate signal with the first time-series pattern and an inverted signal of the gate signal with the second time-series pattern at the phase time point in the quarter-period in each half period as the reference time point.

(d) In the one period of the modulation wave, each switching element in each leg is subjected to the drive control by switching between the gate signal with the first time-series pattern and the gate signal with the second time-series pattern in each half period, so as to convert a DC input into an AC output by the pulse width modulation (PWM).

The PWM control unit 6 compares the modulation wave S with the carrier wave C to generate a gate signal, so as to output the generated signal as a PWM pulse signal for controlling the single-phase PWM inverter 3. The PWM control unit 6 includes a component that generates a PWM pulse signal for controlling the switching element Q1 of the upper arm and the switching element Q2 of the lower arm, these elements forming the first leg of the single-phase PWM inverter 3, and a component that generates a PWM pulse signal for controlling the switching element Q3 of the upper arm and the switching element Q4 of the lower arm, these elements forming the second leg of the single-phase PWM inverter 3.

The component that generates a PWM pulse signal to be applied to the first leg includes a comparison circuit 6a for the first leg to thereby compare the modulation wave S with the carrier wave C. The switching element Q1 of the upper arm forming the first leg is provided with the PWM pulse signal generated by the comparison circuit 6a, and the switching element Q2 of the lower arm forming the first leg is provided with a PWM pulse signal that is inverted by a NOT circuit.

On the other hand, the component that generates a PWM pulse to be applied to the second leg includes a comparison circuit 6b for the second leg and an inversion circuit 6c that inverts a signal of the modulation wave S. The comparison circuit 6b compares a modulation wave S* inverted by the inversion circuit 6c with a voltage of the carrier wave C to generate a PWM pulse signal. The switching element Q3 of the upper arm forming the second leg is provided with a pulse signal generated by the comparison circuit 6b. By contrast, the switching element Q4 of the lower arm forming the second leg is provided with a gate signal that is generated by the comparison circuit 6b and inverted by the NOT circuit.

FIG. 7 shows an example of a waveform according to the configuration example shown in FIG. 6.

FIGS. 7(a) and 7(b) show examples of the waveform of the modulation wave S and the inverted modulation wave S*, FIG. 7(c) shows a triangular wave of the carrier wave C, and FIGS. 7(d) to 7(g) show gate signals. These figures show examples of the carrier wave C with the number of pulses N being 6.

The gate signal shown in FIG. 7(d) is generated by comparing the sine wave of the modulation wave S (FIG. 7(a)) with the triangular wave of the carrier C (FIG. 7(c)), and is supplied to the switching element Q1 of the upper arm of the first leg. The gate signal shown in FIG. 7(e) is an inverted signal obtained by inverting the gate signal shown in FIG. 7(d) by the NOT circuit, and is supplied to the switching element Q2 of the lower arm of the first leg.

On the other hand, the gate signal shown in FIG. 7(f) is generated by comparing the inverted sine wave of the modulation wave S (FIG. 7(b)) with the triangular wave of the carrier C (FIG. 7(c)), and is supplied to the switching element Q3 of the upper arm of the second leg. The gate signal shown in FIG. 7(g) is an inverted signal obtained by inverting the gate signal shown in FIG. 7(f) by the NOT circuit, and is supplied to the switching element Q4 of the lower arm of the second leg.

The gate signal of the upper arm of the first leg shown in FIG. 7(d) has a time-series pattern in an anterior half period as a first time-series pattern and a time-series pattern in a posterior half period as a second time-series pattern.

The time-series pattern in FIG. 7(d) showing the gate signal of the upper arm of the first leg and the time-series pattern in FIG. 7(f) showing the gate signal of the upper arm of the second leg represent that the first time-series pattern and the second time-series pattern alternately appear in the anterior half period and the posterior half period in the one period of the modulation wave S.

The time-series pattern in FIG. 7(e) showing the gate signal of the lower arm of the first leg and the time-series pattern in FIG. 7(g) showing the gate signal of the lower arm of the second leg also represent that the time-series pattern in the anterior half period and the time-series pattern in the posterior half period alternately appear in the one period of the modulation wave S. Since the time-series pattern in each leg in the one period alternates in the half period, voltage waveforms of the switching elements alternately appear in the half period according to the time-series patterns, so that the switching losses occurring in the one period are equalized between the legs.

The embodiments and the variations described above are some examples of the wideband RF power supply according to the present invention, and thus the invention is not limited to these embodiments. Furthermore, the present invention can be modified in various ways based on the purport of the invention, which will not be excluded from the scope of the invention.

INDUSTRIAL APPLICABILITY

The RF band power supply device and the pulse width modulation control method of the present invention can be applied to a radio-frequency power source (RF generator) to be used for semiconductor manufacturing equipment, liquid crystal panel manufacturing equipment or the like.

REFERENCE SIGNS LIST

1 RF Band Power Supply Device
2 DC Power Source
3 Single-Phase PWM Inverter
4 Low-Pass Filter
5 Inverter Controller
6 PWM Control Unit
6a Comparison Circuit
6b Comparison Circuit
6c Inversion Circuit
7 Carrier Wave Generation Unit
7a Frequency Synchronization Unit
7b Odd Function Control Unit
7c Phase Synchronization Unit
20 Class-D Full-Bridge Circuit
Br Full-Bridge Circuit
C Carrier Wave
Ca Capacitor
D Duty Ratio
fc Carrier Wave Frequency
fs Modulation Wave Frequency
L Inductor
N Number of Pulses
Q1, Q2, Q3, Q4 Switching Element
R Load
S Modulation Nave
S* Modulation Wave
S1, S2 Modulation Wave
Tr Output Transformer
Vd DC Voltage
$V_{inv}$ Inverter Output
$V_{out}$ Sine Wave Output
$V_{means}$ Mean Voltage at Midpoint between Legs of Single-Phase Bridge Circuit
$V_2$ Output of Output Transformer Tr

The invention claimed is:

1. An RF band power supply device, comprising:
a DC power source;
a single-phase PWM inverter that comprises a single-phase full-bridge circuit formed by parallel-connecting two legs having switching elements on upper and lower arms between a positive end and a negative end of the DC power source, and convert a DC input supplied from the DC power source into an AC output by an ON/OFF operation of each switching element; and
an inverter controller that compares a modulation wave with a carrier wave to generate a gate signal, and turns on and off the switching element by using the gate signal as a PWM pulse signal, so as to perform pulse width modulation (PWM) control on the single-phase PWM inverter,
wherein the inverter controller comprises:
a PWM control unit and a modulation wave/carrier wave generation unit for generating the gate signal,
the modulation wave/carrier wave generation unit sets a modulation wave frequency fs of the modulation wave as a frequency in an RF band,
wherein the modulation wave/carrier wave generation unit further comprises:
a frequency synchronization unit that makes a carrier wave frequency fc of the carrier wave to be even-number N times higher than the modulation wave frequency fs;
an odd function control unit that controls the modulation wave to be a sine wave of an odd function and the carrier wave to be a triangular wave of an odd function; and
a phase synchronization unit that synchronizes a phase of the carrier wave with a phase of the modulation wave in each period of the modulation wave.

2. The RF band power supply device according to claim 1, wherein the frequency synchronization unit makes the carrier wave to be point symmetry in which positive and negative of the carrier wave are reversed at a phase time point as a reference time point of a half period a in one period $2\pi$ of the modulation wave.

3. The RF band power supply device according to claim 1 or 2, wherein the odd function control unit alternates a time-series pattern of a gate signal in an anterior half period of the modulation wave and a time-series pattern of a gate signal in a posterior half period of the modulation wave for each half period $\pi$ of the modulation wave in each one period $2\pi$ of the modulation wave for each leg, so as to generate a gate signal having alternation at the phase time point in the half period $\pi$ as the reference time point.

4. The RF band power supply device according to claim 3, wherein the power supply device has two modulation waves having opposite phases, and
the odd function control unit is configured to:
generate a gate signal with a first time-series pattern in which the time-series patterns are identical with each other for driving a switching element of one of the legs in the anterior half period of the modulation wave while driving a switching element of the other leg in the posterior half period of the modulation wave by comparing one of the modulation waves having the opposite phases with the carrier wave;
generate a gate signal with a second time-series pattern in which the time-series patterns are identical with each other for driving a switching element of the one of the legs in the posterior half period of the modulation wave while driving a switching element of the other leg in the anterior half period of the modulation wave by comparing the other modulation wave which is out of phase by $\pi$ with respect to the one of the modulation waves;
provide the alternation at a phase time point in the half period $\pi$ as a reference time point in the one period of the modulation wave to two gate signals, in which the order is altered between the gate signal with the first time-series pattern and the gate signal with the second time-series pattern at the phase time point in the half period $\pi$ of the modulation wave as the reference time point; and
perform drive control on each switching element of each leg in the one period of the modulation wave by switching the gate signal with the first time-series pattern and the gate signal with the second time-series pattern for each half period, so as to convert the DC input into the AC output by the pulse width modulation (PWM).

5. The RF band power supply device according to claim 3, wherein the power supply device has two modulation waves having opposite phases, and
the odd function control unit is configured to:
generate a gate signal with a first time-series pattern in which the time-series patterns are identical with each other for driving a switching element of one of the legs in the anterior half period of the modulation wave while driving a switching element of the other leg in the posterior half period of the modulation wave by comparing one of the modulation waves having the opposite phases with the carrier wave;

generate a gate signal with a second time-series pattern in which the time-series patterns are identical with each other for driving a switching element of the one of the legs in the posterior half period of the modulation wave while driving a switching element of the other leg in the anterior half period of the modulation wave by comparing the other modulation wave which is out of phase by π with respect to the one of the modulation waves;

provide the symmetry at a phase time point in the quarter-period as a reference time point in the half period between the gate signal with the first time-series pattern and an inverted signal of the gate signal with the second time-series pattern in the half period of the modulation wave; and perform drive control on each switching element of each leg in the one period of the modulation wave by switching the gate signal with the first time-series pattern and the gate signal with the second time-series pattern for each half period, so as to convert the DC input into the AC output by the pulse width modulation (PWM).

6. The RF band power supply device according to claim 4, wherein the PWM control unit comprises two comparison circuits, one of the two comparison circuits comparing one of modulation waves S having opposite phases with a carrier wave C to generate a gate signal for driving the switching element of one of the two legs, the other comparison circuit of the two comparison circuits comparing the other modulation wave S having the opposite phase with the carrier wave C to generate a gate signal for driving the switching element of the other leg of the two legs.

7. The RF band power supply device according to claim 1, wherein the odd function control unit reverses a time-series pattern of a gate signal in an anterior quarter-period and a time-series pattern of a gate signal in a posterior quarter-period of the modulation wave in each half period π of the modulation wave at a point π/2 of a quarter-period of the modulation wave for each leg, so as to generate a gate signal that is symmetrical at a phase time point of the quarter-period π/2 as a reference time point.

8. A pulse width modulation control method for a single-phase PWM inverter that generates a gate signal based on a comparison between a modulation wave in an RF band and a carrier wave, and performs pulse width modulation (PWM) control on the single-phase PWM inverter by using the generated gate signal as a PWM pulse signal to output a sine wave in the RF band, defining a modulation wave frequency fs of the modulation wave as a frequency in the RF band, the pulse width modulation control method comprising:

a frequency synchronization control step for defining a carrier wave frequency fc of the carrier wave to be even-number N times higher than the modulation wave frequency fs;

an odd function control step for controlling the modulation wave to be a sine wave of an odd function and the carrier wave to be a triangular wave of an odd function; and a phase synchronization control step for synchronizing a phase of the carrier wave with a phase of the modulation wave in each period of the modulation wave.

9. The pulse width modulation control method according to claim 8, wherein the odd function control step is for:

providing alternation at a phase time point in a half period π as a reference time point in one period 2π of the modulation wave, and alternating a time-series pattern of a gate signal in an anterior half period and a time-series pattern of a gate signal in a posterior half period of the modulation wave for each half period a of the modulation wave in each one period 2π of the modulation wave for each leg, so as to generate a gate signal having the alternation at the phase time point in the half period π as the reference time point.

10. The pulse width modulation control method according to claim 8, wherein the odd function control step is for:

providing symmetry at a phase time point in a half period π as a reference time point in one period 2π of the modulation wave, and alternating a time-series pattern of a gate signal in an anterior quarter-period and a time-series pattern of a gate signal in a posterior quarter-period of the modulation wave for each quarter-period π/2 of the modulation wave in each half period π of the modulation wave for each leg, so as to generate a gate signal symmetrical at the phase time point in the quarter-period π/2 as the reference time point.

* * * * *